United States Patent
Blanchard

(10) Patent No.: US 7,015,104 B1
(45) Date of Patent: Mar. 21, 2006

(54) TECHNIQUE FOR FORMING THE DEEP DOPED COLUMNS IN SUPERJUNCTION

(75) Inventor: Richard A. Blanchard, Los Altos, CA (US)

(73) Assignee: Third Dimension Semiconductor, Inc., Tempe, AZ (US)

(*) Notice: Subject to any disclaimer, the term of this patent is extended or adjusted under 35 U.S.C. 154(b) by 90 days.

(21) Appl. No.: 10/857,323

(22) Filed: May 28, 2004

Related U.S. Application Data

(60) Provisional application No. 60/474,127, filed on May 29, 2003.

(51) Int. Cl.
H01L 21/336 (2006.01)

(52) U.S. Cl. ..................... 438/270; 438/525

(58) Field of Classification Search ............. None
See application file for complete search history.

(56) References Cited

U.S. PATENT DOCUMENTS

| | | |
|---|---|---|
| 4,158,206 A | 6/1979 | Neilson |
| 4,895,810 A | 1/1990 | Meyer et al. |
| 5,019,522 A | 5/1991 | Meyer et al. |
| 5,045,903 A | 9/1991 | Meyer et al. |
| 5,216,275 A | 6/1993 | Chen |
| 5,366,914 A | 11/1994 | Takahashi et al. |
| 5,472,888 A | 12/1995 | Kinzer |
| 5,506,421 A | 4/1996 | Palmour |
| 5,598,018 A | 1/1997 | Lidow et al. |
| 5,742,087 A | 4/1998 | Lidow et al. |
| 5,744,994 A | 4/1998 | Williams |
| 5,786,619 A | 7/1998 | Kinzer |
| 5,929,690 A | 7/1999 | Williams |
| 5,939,754 A | 8/1999 | Hoshi |
| 6,081,009 A | 6/2000 | Neilson |
| 6,174,773 B1 * | 1/2001 | Fujishima ............... 438/270 |
| 6,184,555 B1 | 2/2001 | Tihanyi et al. |
| 6,190,970 B1 | 2/2001 | Liao et al. |
| 6,222,229 B1 | 4/2001 | Hebert et al. |
| 6,239,463 B1 | 5/2001 | Williams et al. |
| 6,291,856 B1 | 9/2001 | Miyasaka et al. |
| 6,307,246 B1 | 10/2001 | Nitta et al. |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usi et al. |
| 6,452,230 B1 | 9/2002 | Boden, Jr. |
| 6,459,142 B1 | 10/2002 | Tihanyi |
| 6,495,421 B1 | 12/2002 | Luo |
| 6,501,130 B1 | 12/2002 | Disney |

(Continued)

*Primary Examiner*—Chandra Chaudhari
(74) *Attorney, Agent, or Firm*—Akin Gump Strauss Hauer & Feld, LLP

(57) ABSTRACT

A method of manufacturing a semiconductor device is disclosed and starts with a semiconductor substrate having a heavily doped N region of at the bottom main surface and having a lightly doped N region at the top main surface. There are a plurality of trenches in the substrate, with each trench having a first extending portion extending from said top main surface towards the heavily doped region. Each trench has two sidewall surfaces in parallel alignment with each other. A blocking layer is formed on the sidewalls and the bottom of each trench. Then a P type dopant is obliquely implanting into the sidewall surfaces to form P type doped regions. The blocking layer is then removed. The bottom of the trenches is then etched to remove any implanted P type dopants. The implants are diffused and the trenches are filled.

21 Claims, 24 Drawing Sheets

U.S. PATENT DOCUMENTS

| | | |
|---|---|---|
| 6,504,230 B1 | 1/2003 | Deboy et al. |
| 6,509,220 B1 | 1/2003 | Disney |
| 6,534,367 B1 * | 3/2003 | Peake et al. ............ 438/270 |
| 6,566,201 B1 | 5/2003 | Blanchard |
| 6,624,494 B1 | 9/2003 | Blanchard et al. |
| 6,686,244 B1 | 2/2004 | Blanchard |
| 6,710,400 B1 | 3/2004 | Blanchard |
| 6,710,403 B1 | 3/2004 | Sapp |
| 6,710,418 B1 | 3/2004 | Sapp |
| 6,713,813 B1 | 3/2004 | Marchant |
| 2002/0070418 A1 | 6/2002 | Kinzer et al. |

* cited by examiner

CONVENTIONAL MOSFET

THE DOPANT DISTRIBUTION OF A HIGH VOLTAGE VERTICAL
DMOS TRANSISTOR WITH A RELATIVELY LOW ON-RESISTANCE

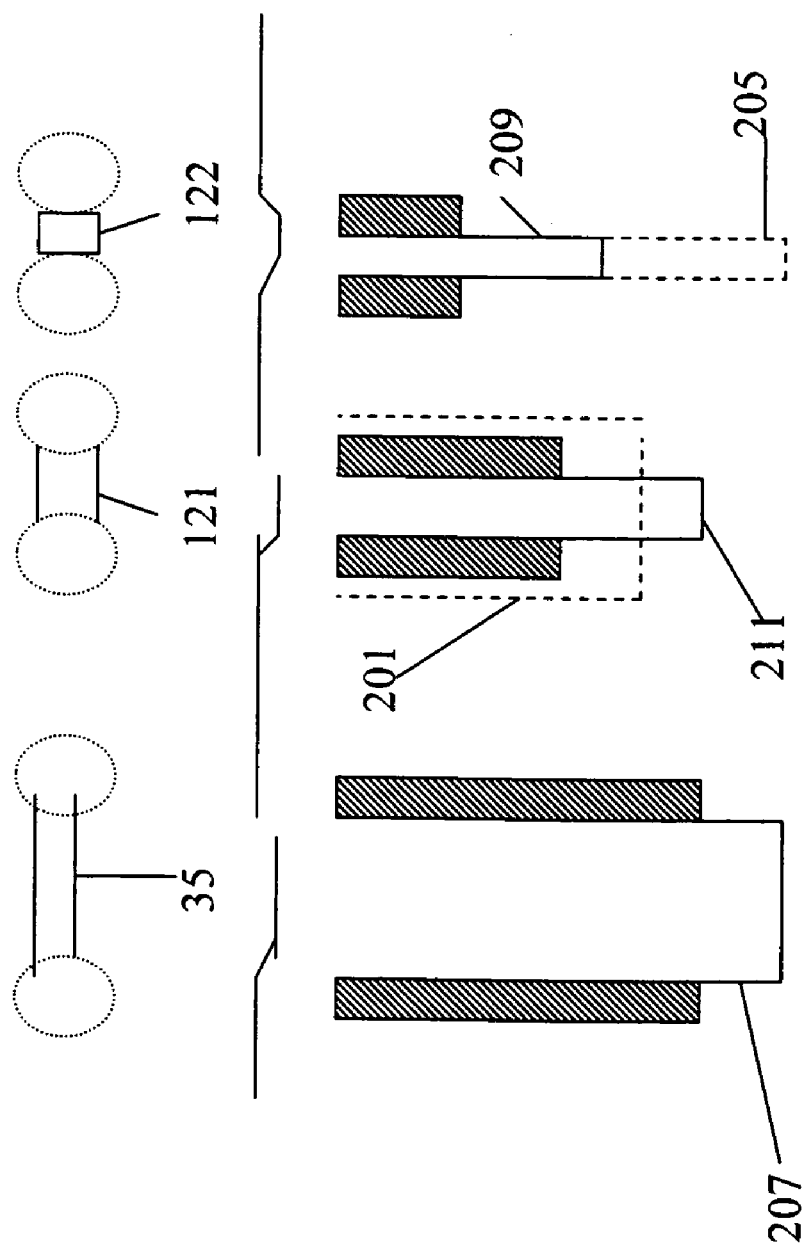

TECHNIQUE FOR FORMING THE DEEP DOPED COLUMNS IN SUPERJUNCTION

This application claims the benefit of Provisional Application No. 60/474,127, filed May 29, 2003.

FIELD OF THE INVENTION

The present invention relates generally to semiconductor devices, and more, particularly, to power MOSFET devices.

BACKGROUND OF THE INVENTION

Power MOSFET devices are employed in applications such as automobile electrical systems, power supplies, and power management applications. Such devices should sustain high voltage in the off-state while having a low voltage drop and high current flow in the on-state.

FIG. 1 illustrates a typical structure for an N-channel power MOSFET. An N-epitaxial silicon layer 1 formed over an N+ silicon substrate 2 contains p-body regions 5a and 6a, and N+ source regions 7 and 8 for two MOSFET cells in the device. P-body regions 5 and 6 may also include deep p-body regions 5b and 6b. A source-body electrode 12 extends across certain surface portions of epitaxial layer 1 to contact the source and body regions. The N-type drain for both cells is formed by the portion of N-epitaxial layer 1 extending to the upper semiconductor surface in FIG. 1. A drain electrode is provided at the bottom of N+ substrate 2. An insulated gate electrode 18 typically of polysilicon lies primarily over the body and portions of the drain of the device, separated from the body and drain by a thin layer of dielectric, often silicon dioxide. A channel is formed between the source and drain at the surface of the body region when the appropriate positive voltage is applied to the gate with respect to the source and body electrode.

The on-resistance of the conventional MOSFET shown in FIG. 1 is determined largely by the drift zone resistance in epitaxial layer 1. The drift zone resistance is in turn determined by the doping and the layer thickness of epitaxial layer 1. However, to increase the breakdown voltage of the device, the doping concentration of epitaxial layer 1 must be reduced while the layer thickness is increased. Curve 20 in FIG. 2 shows the on-resistance per unit area as a function of the breakdown voltage for a conventional MOSFET. Unfortunately, as curve 20 shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in paper No. 26.2 in the Proceedings of the IEDM, 1998, p. 683. This MOSFET is similar to the conventional MOSFET shown in FIG. 2 except that it includes p-type doped regions 40 and 42 which extend from beneath the body regions 5 and 6 into the drift region of the device. The p-type doped regions 40 and 42 define columns in the drift region that are separated by n-type doped columns, which are defined by the portions of the epitaxial layer 1 adjacent the p-doped regions 40 and 42. The alternating columns of opposite doping type cause the reverse voltage to be built up not only in the vertical direction, as in a conventional MOSFET, but in the horizontal direction as well. As a result, this device can achieve the same reverse voltage as in the conventional device with a reduced layer thickness of epitaxial layer 1 and with increased doping concentration in the drift zone. Curve 25 in FIG. 2 shows the on-resistance per unit area as a function of the breakdown voltage of the MOSFET shown in FIG. 3. Clearly, at higher operating voltages, the on-resistance of this device is substantially reduced relative to the device shown in FIG. 1, essentially increasing linearly with the breakdown voltage.

The improved operating characteristics of the device shown in FIG. 3 are based on charge compensation in the drift region of the transistor. That is, the doping in the drift region is substantially increased, e.g., by an order of magnitude or more, and the additional charge is counterbalanced by the addition of columns of opposite doping type. The blocking voltage of the transistor thus remains unaltered. The charge compensating columns do not contribute to the current conduction when the device is in its on state. These desirable properties of the transistor depend critically on the degree of charge compensation that is achieved between adjacent columns of opposite doping type. Unfortunately, non-uniformities in the dopant gradient of the columns can be difficult to avoid as a result of limitations in the control of process parameters during their fabrication. For example, diffusion across the interface between the columns and the substrate and the interface between the columns and the p-body region will give rise to changes in the dopant concentration of the portions of the columns near those interfaces.

The structure shown in FIG. 3 can be fabricated with a process sequence that includes multiple epitaxial deposition steps, each followed by the introduction of the appropriate dopant. Unfortunately, epitaxial deposition steps are expensive to perform and thus this structure is expensive to manufacture. Another technique for fabricating these devices is shown in co-pending U.S. application Ser. No. 09/970,972, in which a trench is successively etched to different depths. A dopant material is implanted and diffused through the bottom of the trench after each etching step to form a series of doped regions (so-called "floating islands") that collectively function like the p-type doped regions 40 and 42 seen in FIG. 3. However, the on-resistance of a device that uses the floating island technique is not as low as an identical device that uses continuous columns.

Accordingly, it would be desirable to provide a method of fabricating the MOSFET structure shown in FIG. 3 that requires a minimum number of deposition steps so that it can be produced less expensively while also allowing sufficient control of process parameters so that lightly doped columns that extend almost through a layer of deposited can be formed.

SUMMARY OF THE INVENTION

A method of manufacturing a semiconductor device is disclosed and starts with a semiconductor substrate having a heavily doped N region of at the bottom main surface and a lightly doped N region at the top main surface. There are a plurality of trenches in the substrate, with each trench having a first extending portion extending from the top main surface towards the heavily doped region. Each trench has two sidewall surfaces in parallel alignment with each other. A blocking layer is formed on the sidewalls and the bottom of each trench. Then a P type dopant is obliquely implanting into the sidewall surfaces to form P type doped regions. The blocking layer is then removed. The bottom of the trenches is then etched to remove any implanted P type dopants. The implants are diffused and the trenches are filled.

The body and the source regions are then formed after the gate dielectric and the gate conductor are formed. The body region consists of an implanted P body region on top of each of the diffused P type doped regions to form the body regions and implanted N+regions within the body regions to form source regions. Above the gate dielectric region is a gate conductor that extends over the P-type body and the N+ source regions of two adjoining trenches. A source conductor is connected to the P-type body and the N+ source region.

The un-doped sidewalls will typically be doped with N type dopant. The trenches may have the shape of a dog bone, a rectangle, a rectangle with rounded ends or a cross with the P type dopant being implanted into the ends of the dog bone, a rectangle, or a rectangle with rounded ends, and in opposite sides of the cross.

Rectangular-shaped trenches may be arranged in an array of rows and columns with the ends of the trenches in the column being implanted with P type dopants and the ends of the trenches in the rows being implanted with N type dopants. Cross-shaped trenches may be implanted with P-type dopant along one set of axes, and with N-type dopant along a second set of axes at 90° to the first set.

The angle of the implant can be selected so that the bottom of the trenches are not implanted.

The technique may be used to manufacture the termination regions by varying the shape, the depth and width of the trenches, in conjunction with the implant angle.

The identification of the type of doping use herein only refers to that shown in the particular embodiment. Those skilled in the art know that similar results may be achieved by using P type dopant instead of N type and visa versa. The use of the particular type of dopant in the description of the embodiments should in no way limit the scope of the claims.

BRIEF DESCRIPTION OF THE FIGURES

FIG. 21 shows a top view of the termination region; and

FIG. 22 is a sectional view of FIG. 21.

DETAILED DESCRIPTION OF THE EMBODIMENTS

Figure 8:
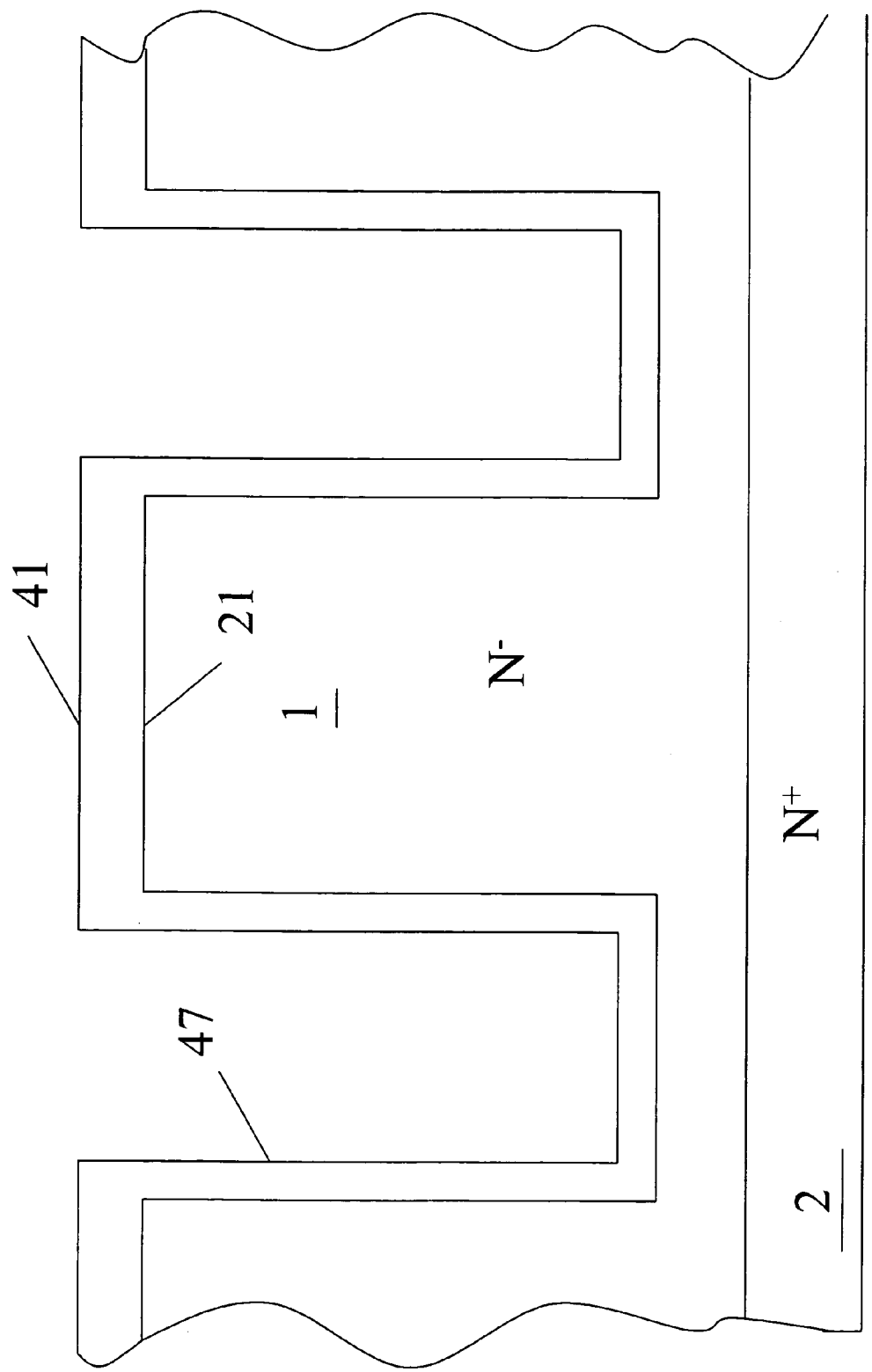
Figure 9:
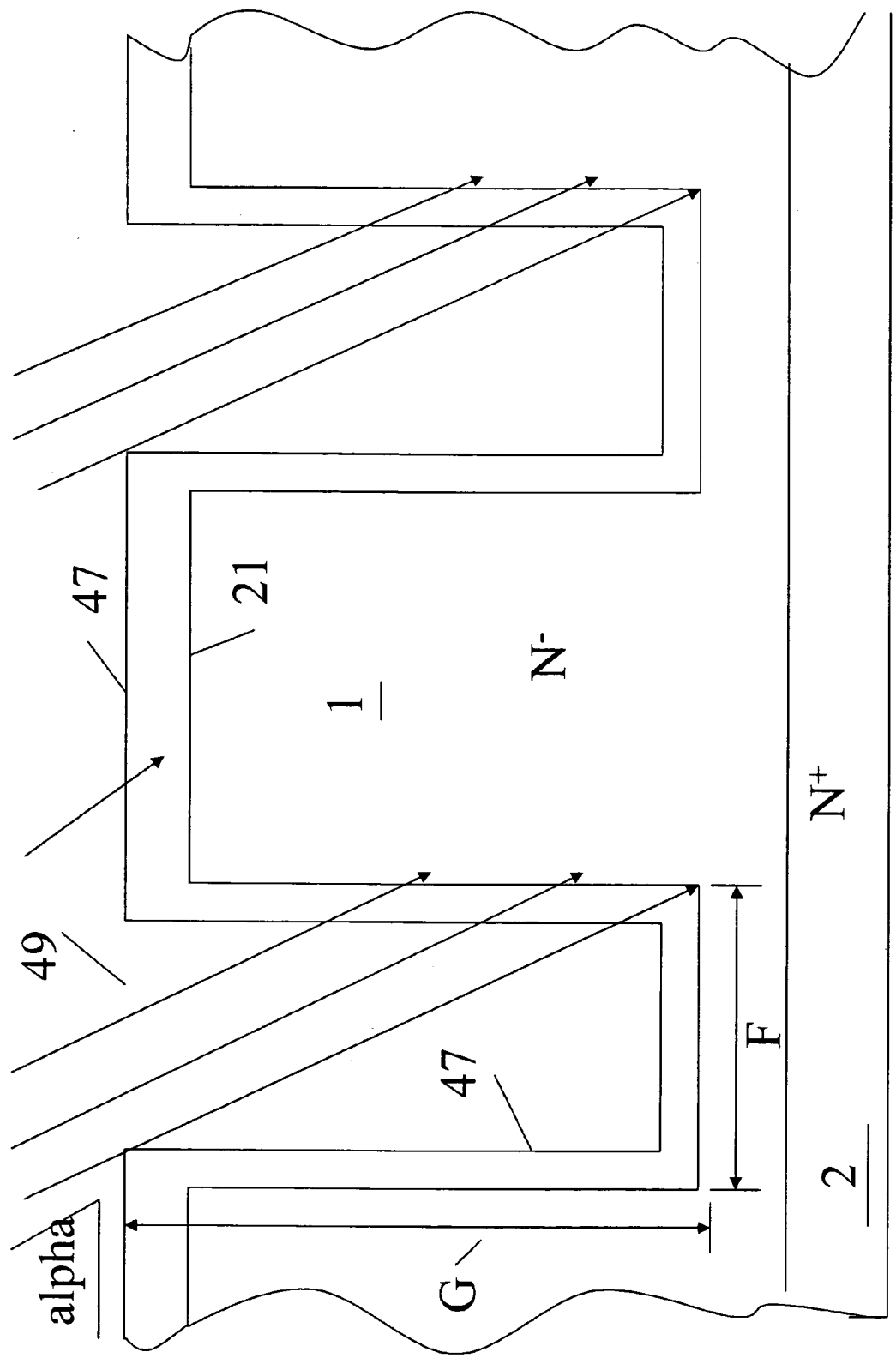
Figure 10:
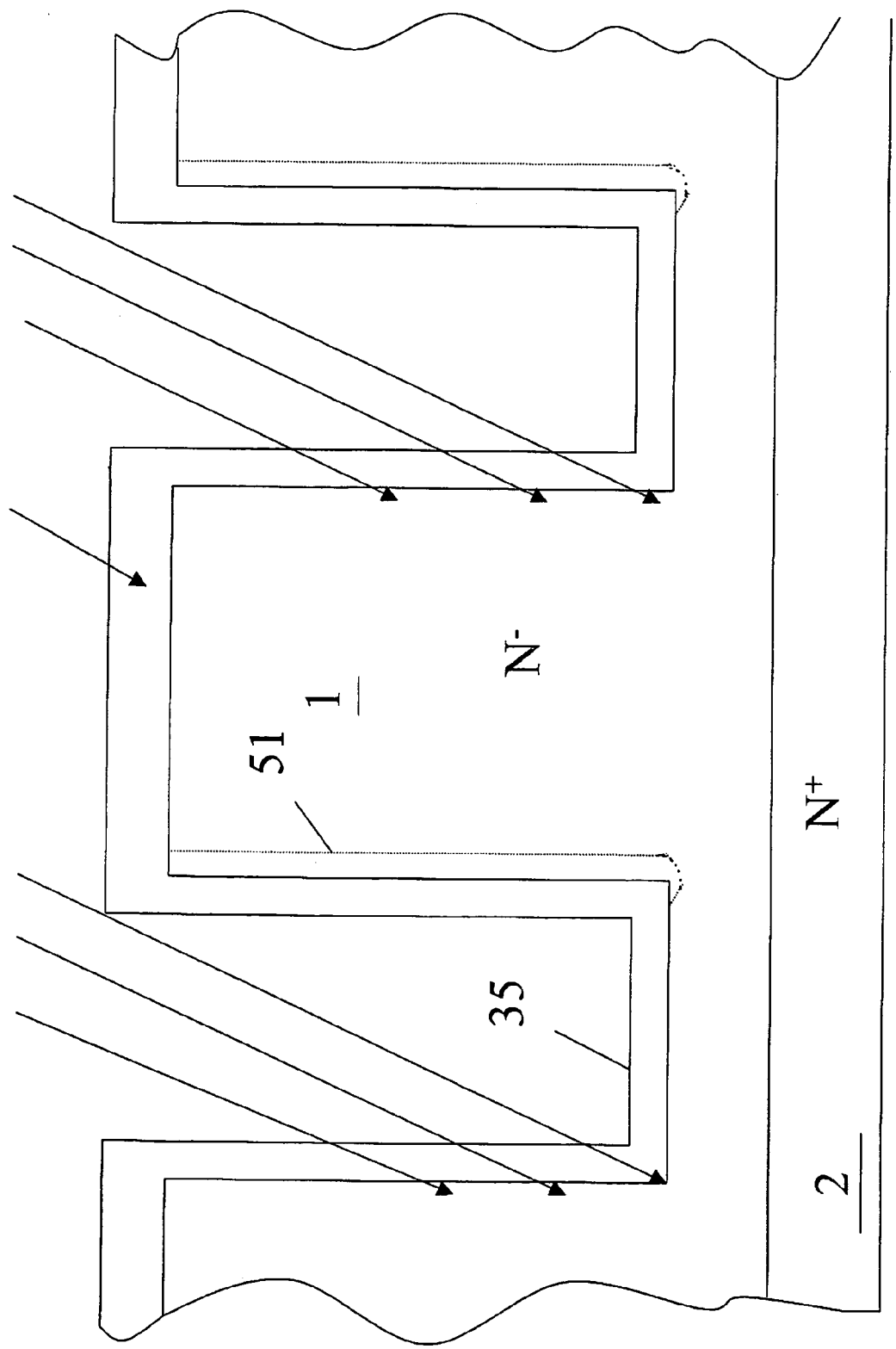
Figure 16:
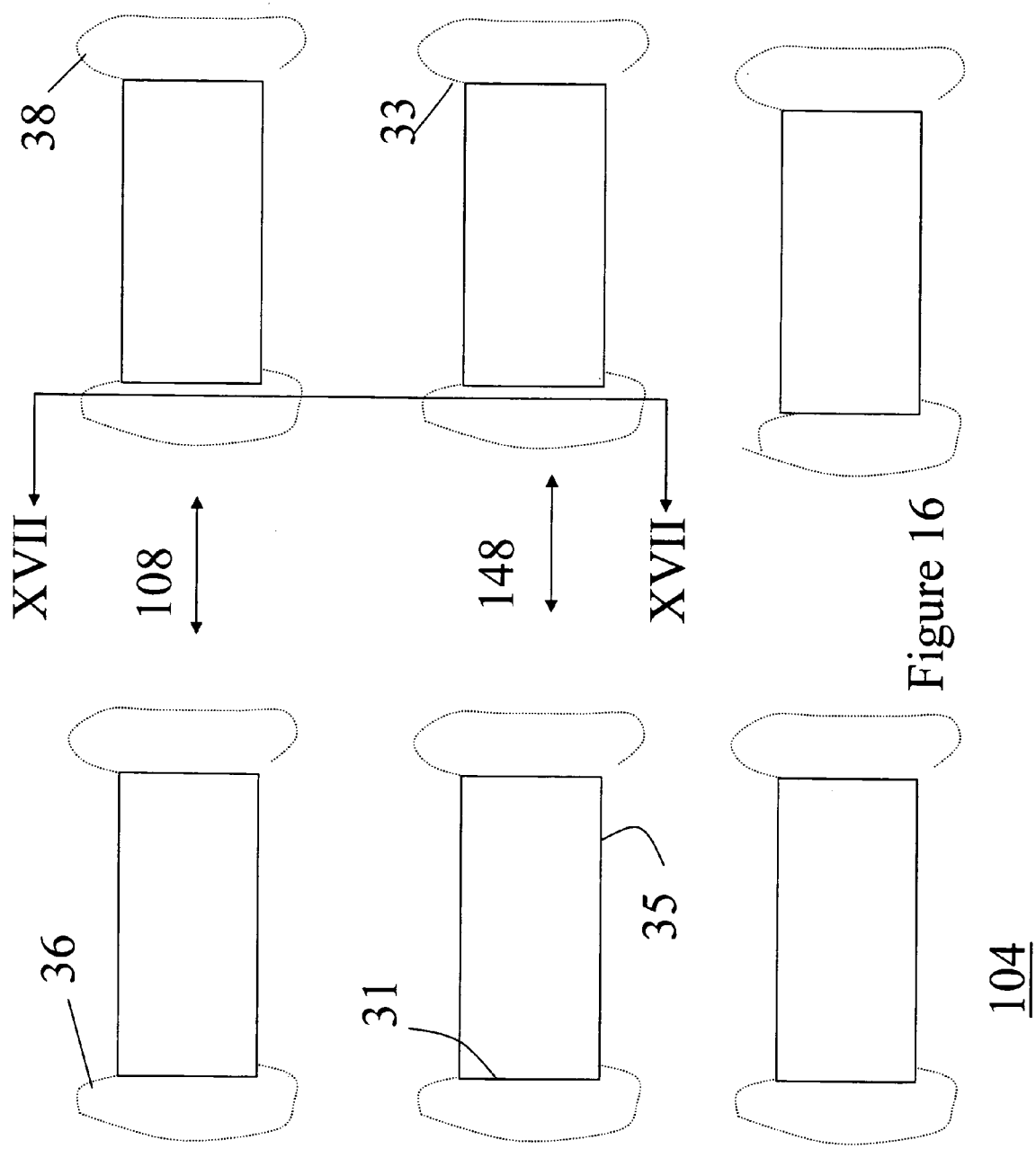
FIGS. 16, 18, and 19 illustrate the different arrangements of the trenches to achieve the disclosed device.

A technique for forming lightly doped columns that extend almost through a layer of deposited epitaxial semiconductor material is best understood by referring to FIGS. 4–18 while reading the description below. This technique uses trenches etched into the silicon to form lightly doped columns. One type of trenches has a dimension in a first direction that is greater than the dimension in a second direction that is perpendicular to the first direction and is generally rectangular shaped, while a second type is cross-shaped. FIG. 16 shows the top view of a series of generally rectangular shaped trenches 35 following two separate implantation steps that have doped the two narrow walls 31 and 33 of the trenches 35. FIGS. 9 and 10 show the technique that is used to perform the two implantation steps. The two separate implantation steps are performed at an angle with respect to the surface of the substrate that allows the dopant to be implanted into just the two narrow "end" sidewalls 31 and 33. The presence of a layer of material such as silicon dioxide or silicon nitride (or a sandwich of such materials) prevents the ions that are being implanted from reaching the semiconductor sidewalls 37 that are along the long axis of each trench. Following the implantation step, any dopant that has been implanted in the bottom of the trench may be removed by etching the trench deeper, and then the dopant may be diffused until the desired dopant distribution is obtained. The trench is then filled using an oxidation or deposition step.

The shape of the trench is not limited to just being rectangular. Many other possible trench shapes such as dog-bones 235, or rectangles with rounded ends 135, (FIG. 15), or crosses are also possible. The profile of the implanted dopant is slightly different, allowing the optimization of the shape of the implanted region. Both of the tench geometries avoid placing dopant atoms near a corner, which might result in better control of the resulting dopant profile.

The pattern of trenches across the surface of the device may also be varied to obtain the best performance. Examples of trench placement are shown in FIG. 16 which shows a square array, FIG. 18 which shows a staggard array 110 and FIG. 19 which illustrates an array 133 of rows and columns. The number and locations of the trenches is important because it affects overall device efficiency.

One fabrication sequence for the doped columns will now be discussed.

Figure 1:
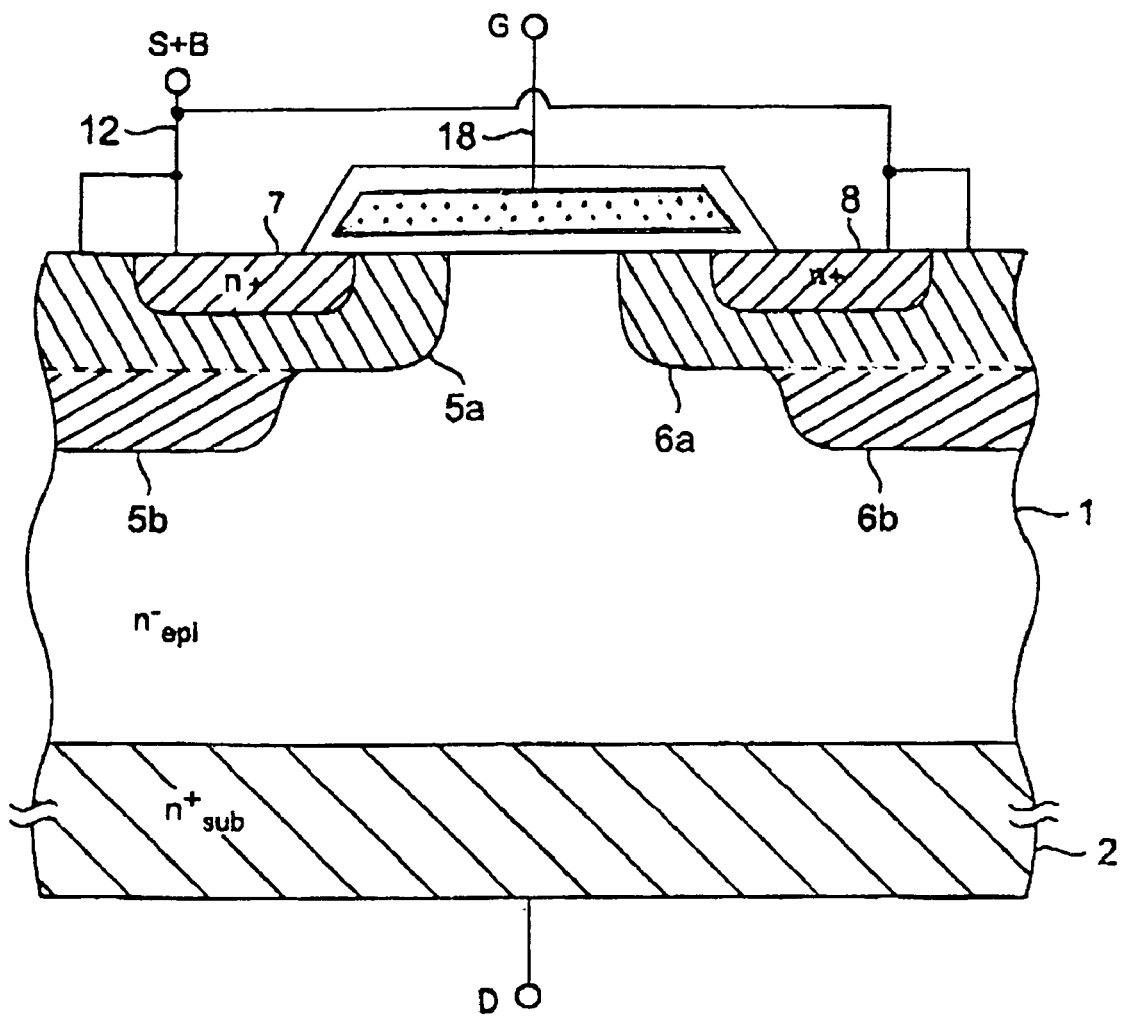
FIG. 1 is a sectional view of a prior art conventional MOSFET.
Figure 2:
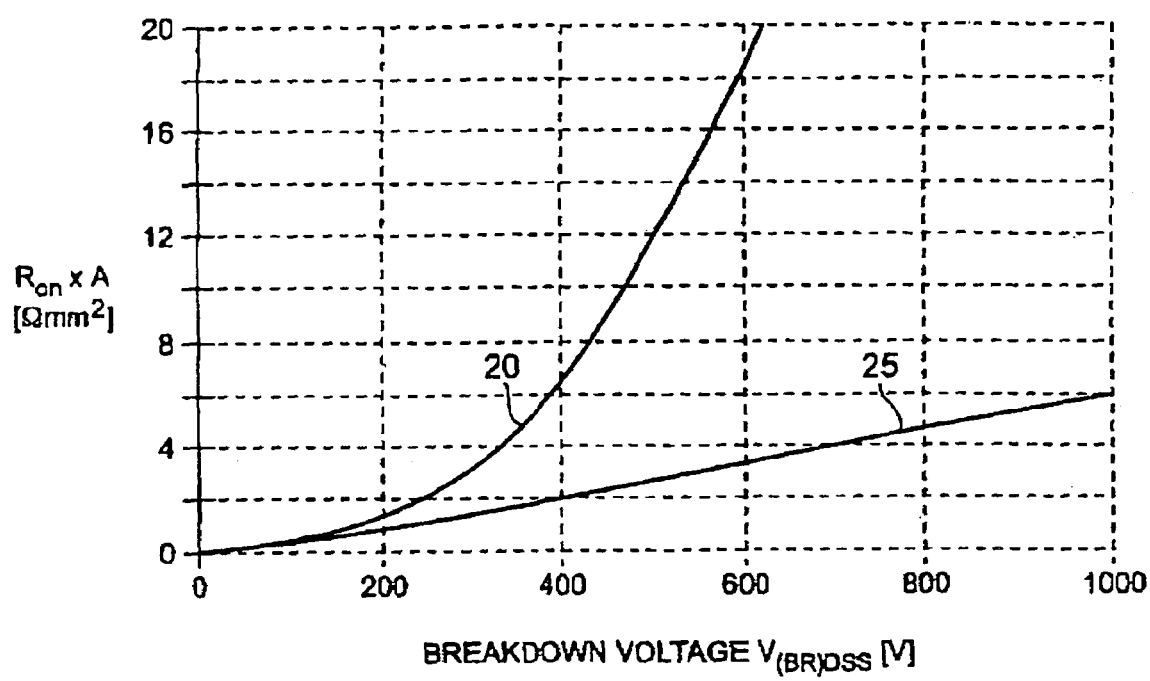
FIG. 2 is a chart showing breakdown voltage the on resistances and current.
Figure 3:
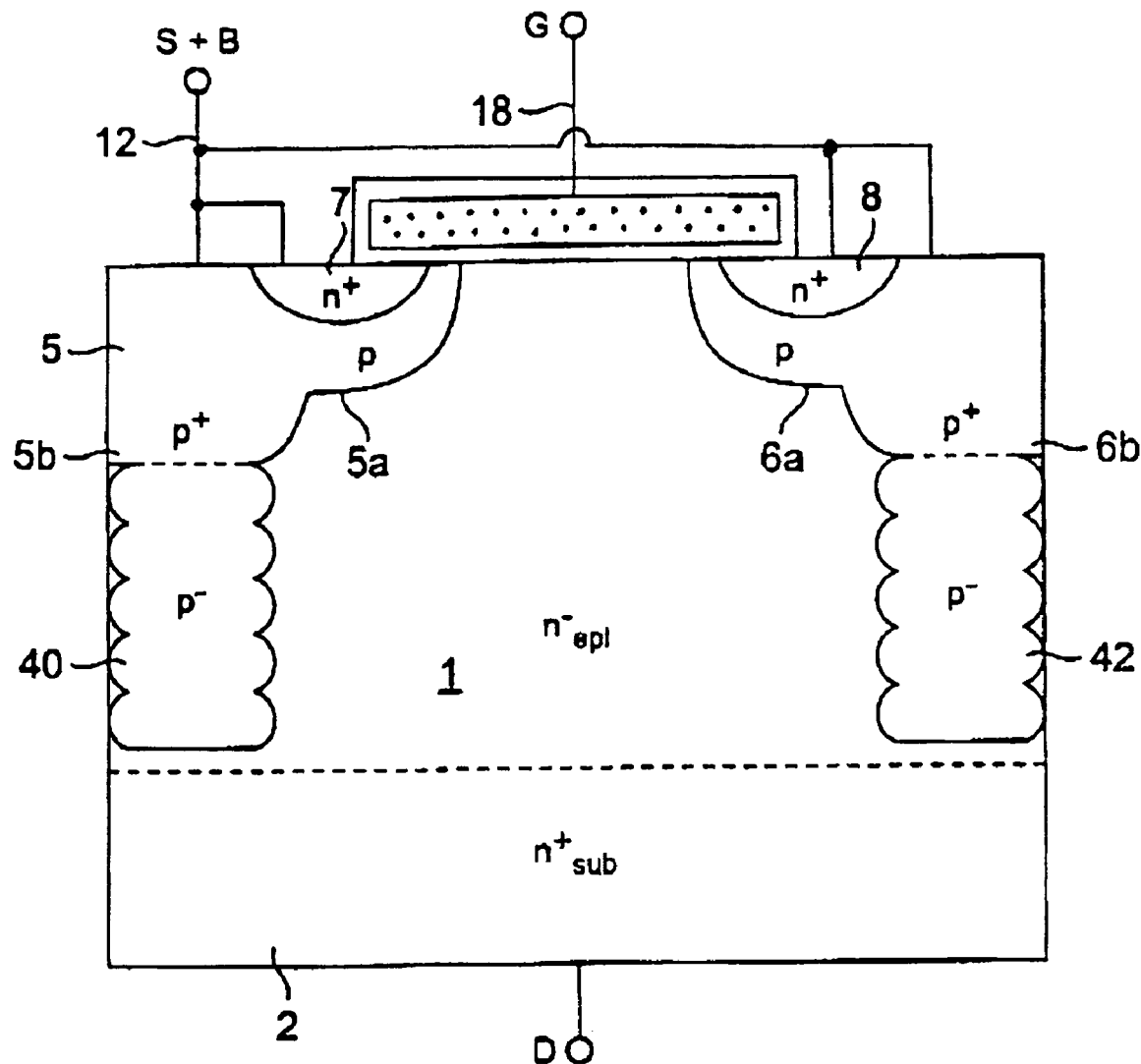
FIG. 3 is a sectional view of a prior art superjunction transistor.
Figure 4:
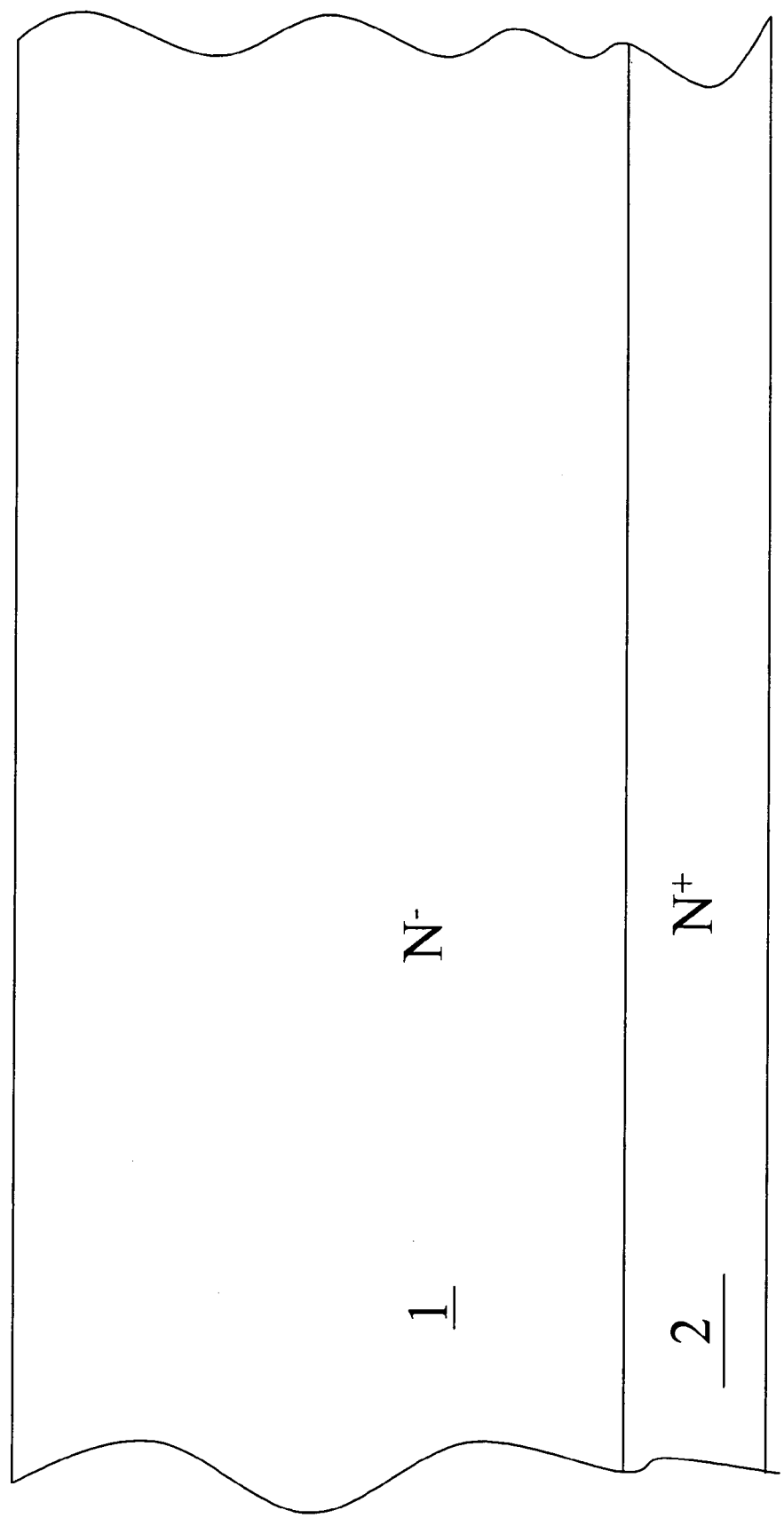
FIGS. 4–14 illustrate the process steps used to manufacture the disclosed semiconductor device.
Figure 5:
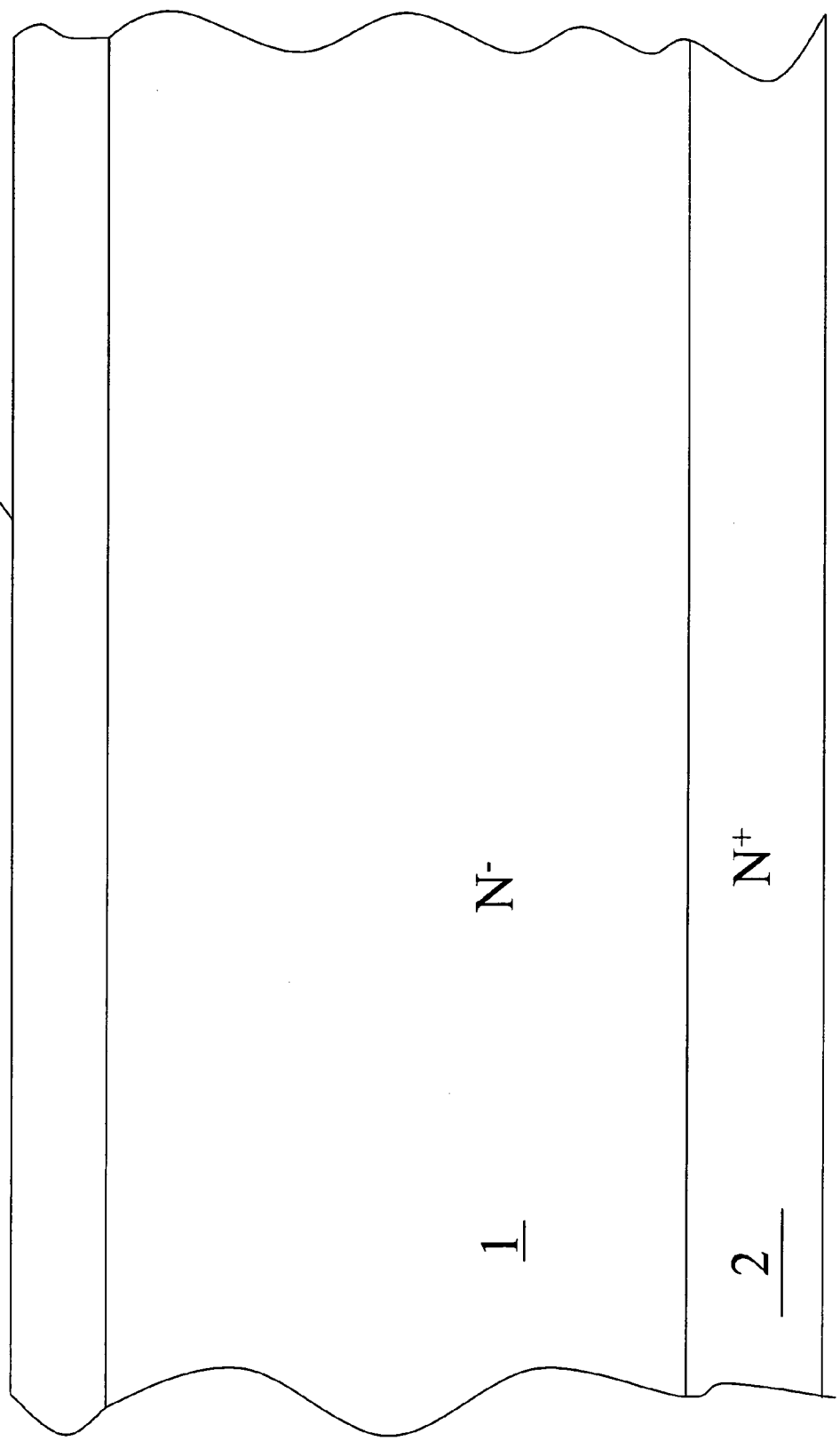
Figure 6:
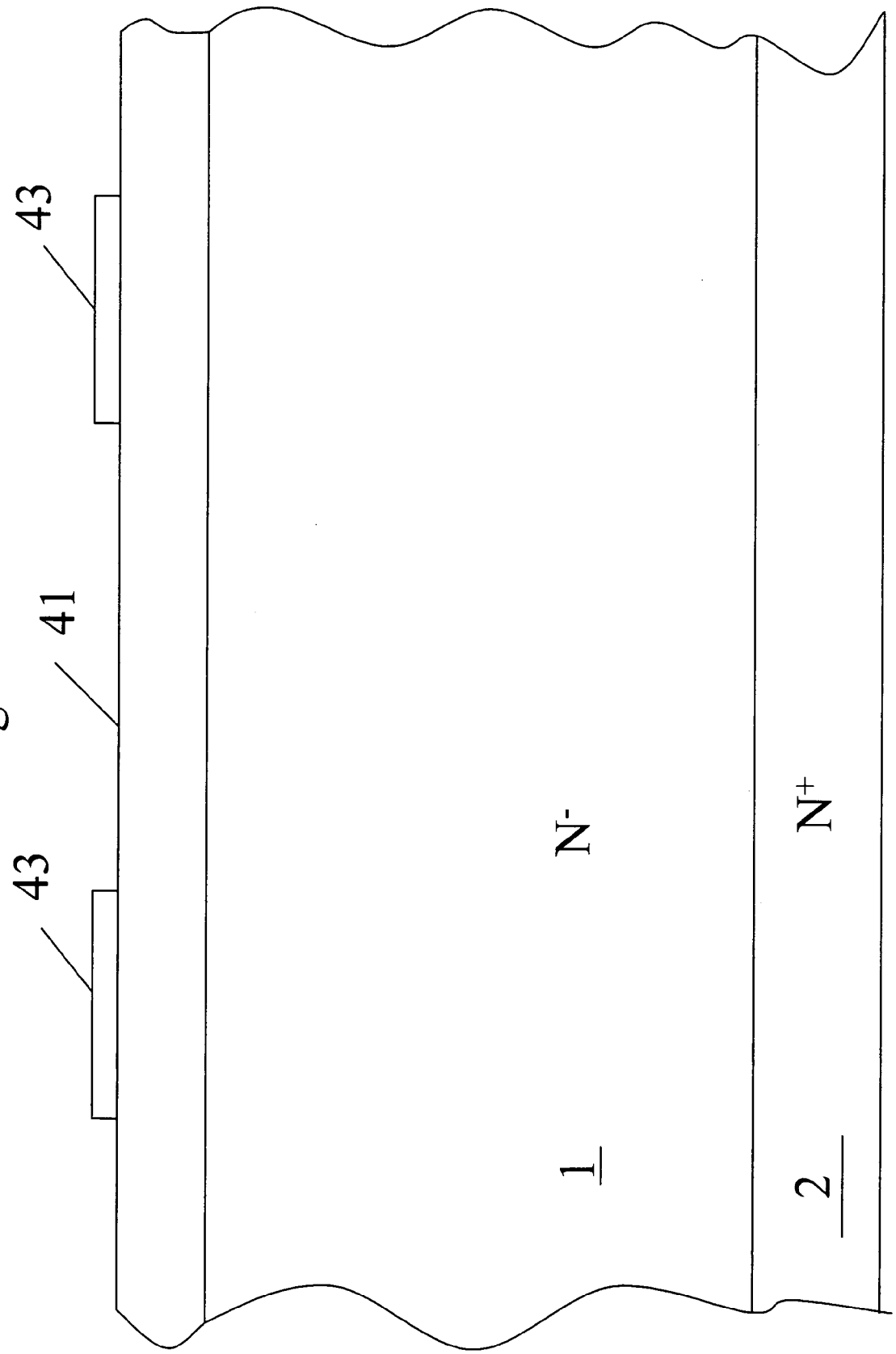
Figure 7:
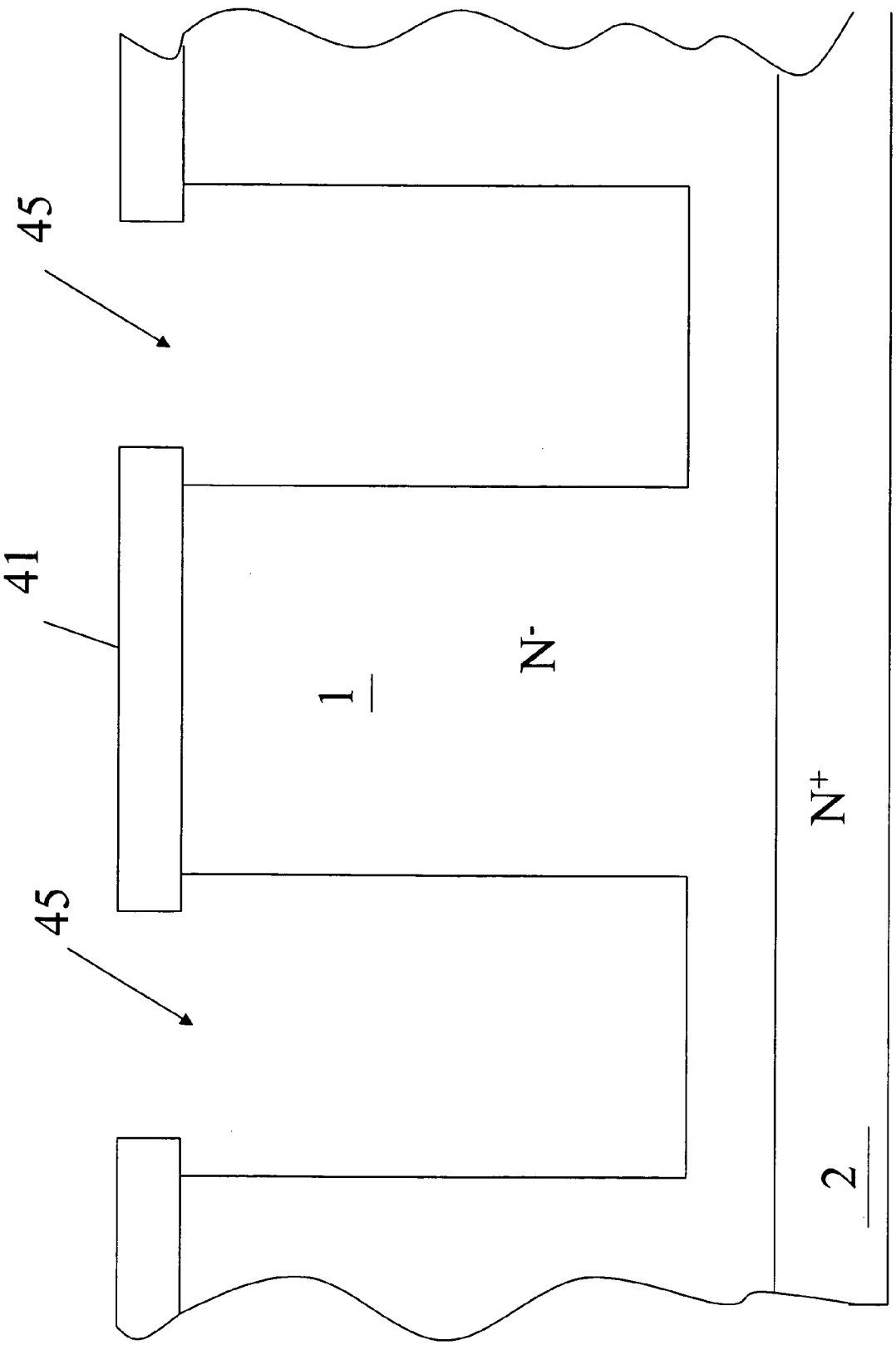

Referring to FIG. 4 a lightly doped epitaxial layer 1 is deposited on a heavily doped substrate 2. Then as shown in FIG. 5 a blocking layer 41 of silicon dioxide is either grown or deposited on the top surface of the epitaxial. The blocking layer has a desired thickness of between 400 and 2,000 A°. In FIG. 6 the blocking layer 41 is masked by a mask 43 to facilitate the its etching. Following the etching of the blocking layer 41, trenches 45 are etched into the epitaxial layer 1 as illustrated in FIG. 7. A blocking layer 47 is grown or deposited on all of the sidewalls and bottoms of each trench 45 as is shown in FIG. 8. The thickness of blocking layer 47 is between 200 and 2000 A°.

Referring to FIG. 9, a first implant of boron ions is performed in the narrow end 33 at an angle alpha that in conjunction with the thickness of the blocking layer 47 will limit the penetration of the dopant in to the epitaxial 1. The thickness of the blocking layer 41 is sufficient enough to prevent the penetration of the dopant into the tops of the columns 21. The result is implanted ions 51 in the column 21 at the small side 33. Generally to prevent the penetrations of the ions in the bottom of the trench alpha should be equal to the tangent G, the depth of the trench ti T, the width of the trench.

Figure 11:
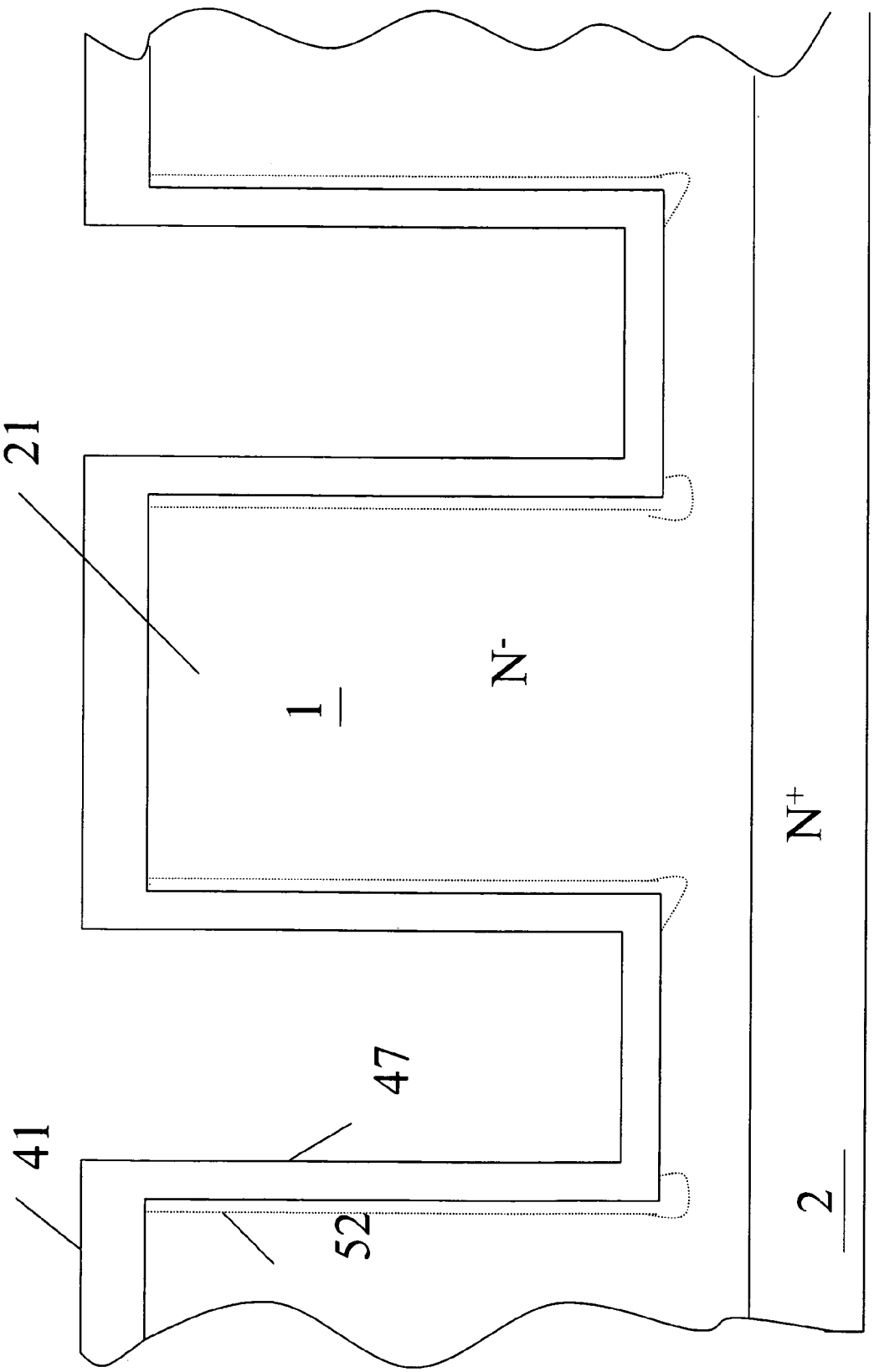

In FIG. 10 a second implant using the same dopant species is performed at the other small side 31 of the trenches 45 at an angle beta that is traditional equal to alpha minus 90 degrees leaving implanted ions 52 in the small side 31 as is shown in FIGS. 10 and 11.

The implants are performed parallel to the long axis, the F side, of the geometry that is used, so no dopant penetrates through the oxide on these sidewalls because of the large angle away from being perpendicular.

Figure 12:
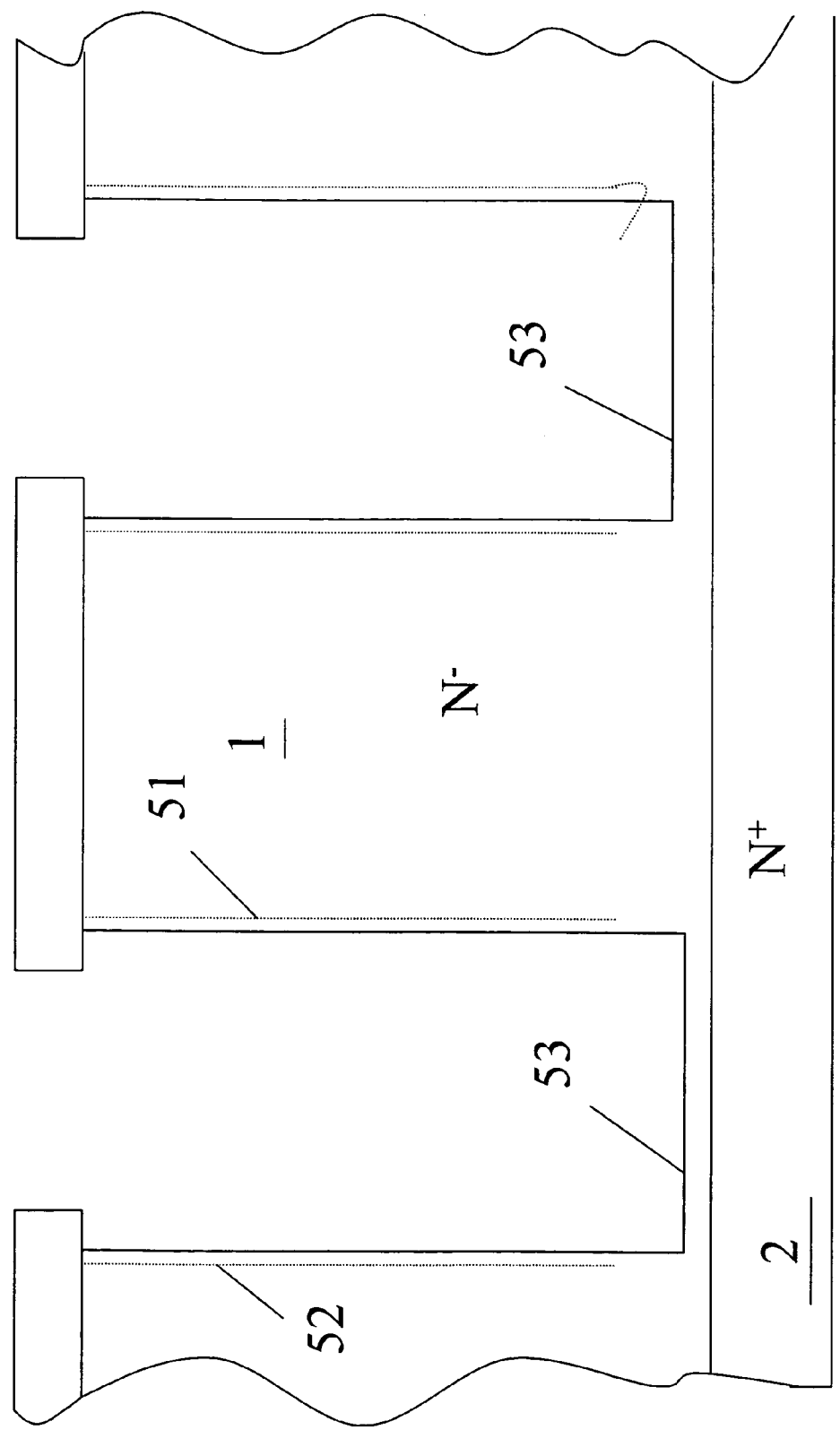

In FIG. 12 the trench is etched to remove the blocking layer 47 and any implanted ions at the bottom of the trenches to a depth H shown generally at 53.

Figure 13:
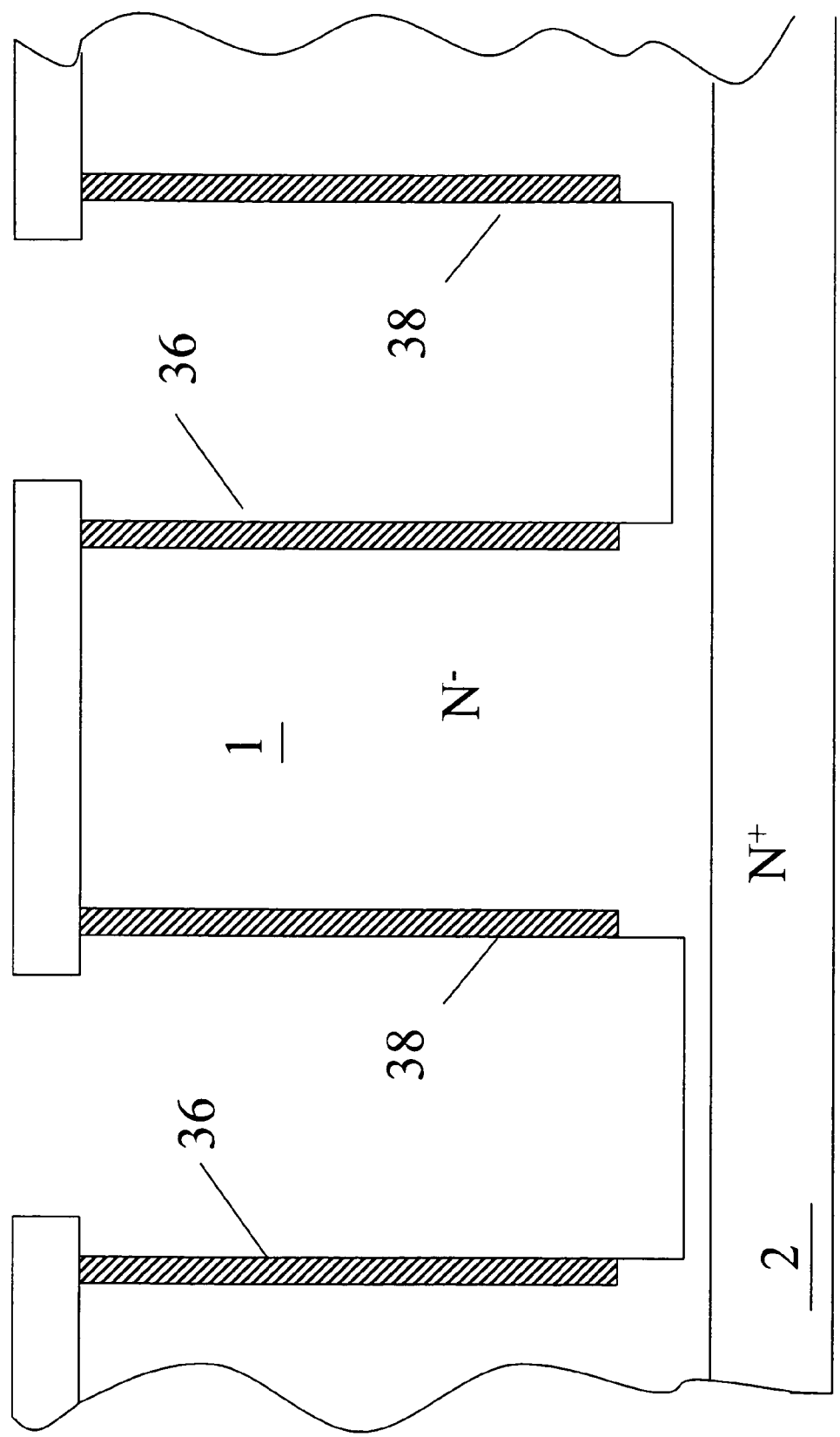
Figure 14:
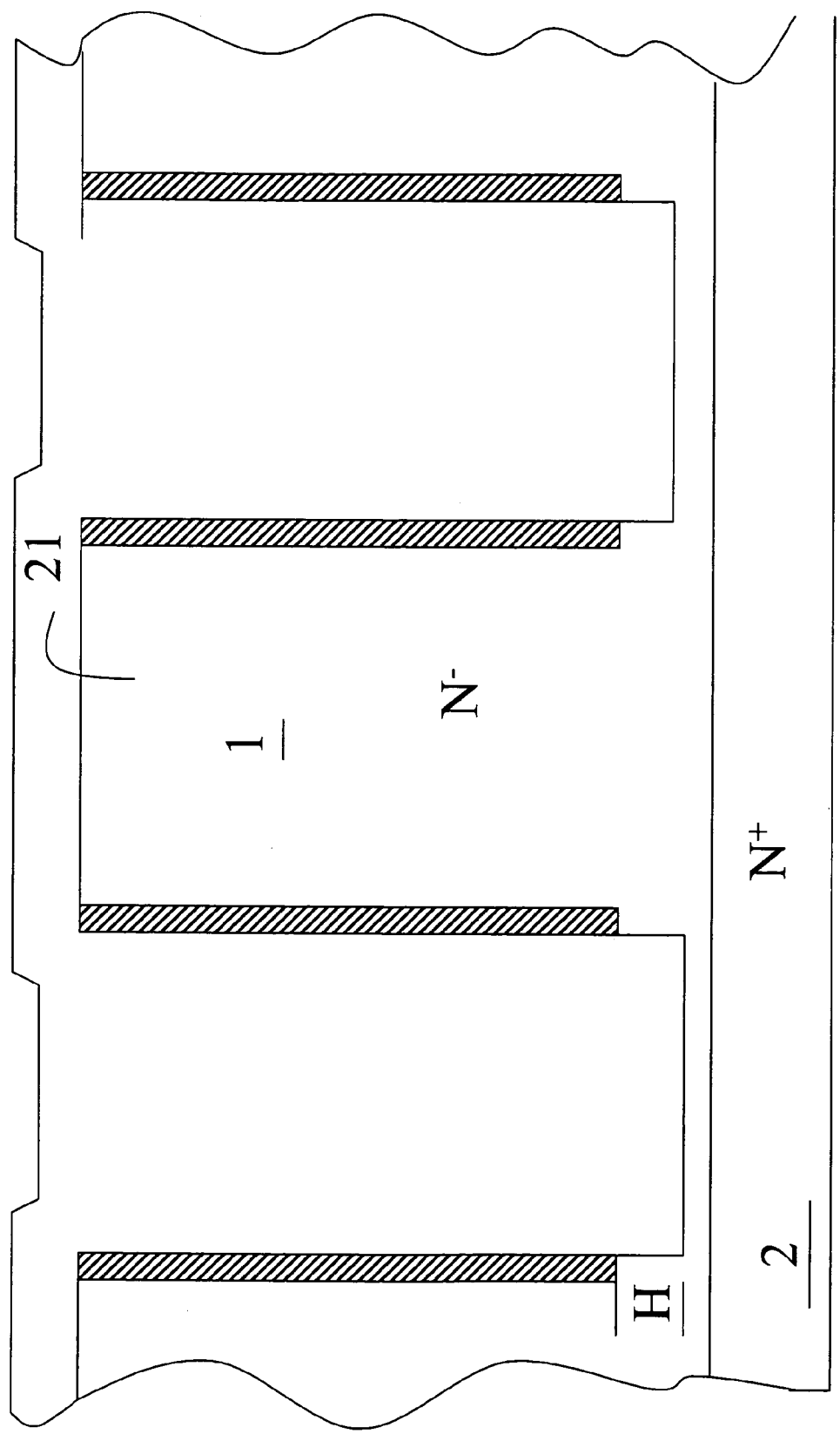
Figure 15A:
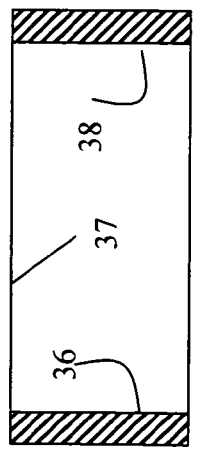
FIGS. 15, 23, 24 and 25 illustrate the different shapes that can be used to manufacture the disclosed semiconductor device.
Figure 15B:
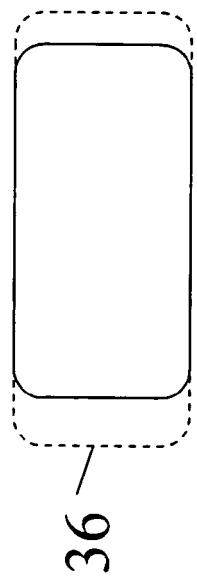
Figure 15C:
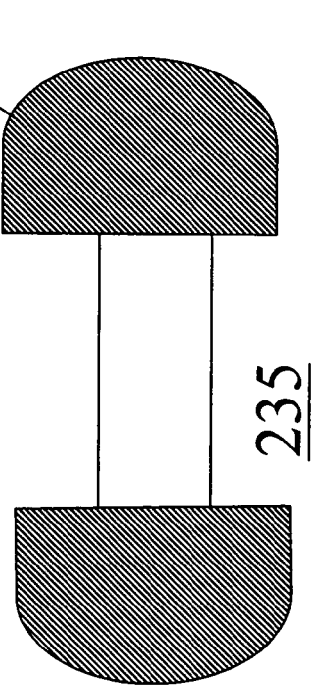

In FIG. 13 a diffusion step is performed to create P-type doped regions 55 and 57. The trenches 45 are filled with an insulator such as silicon dioxide in FIG. 14. The trenches can have many different shapes such as the square shape 100 of FIG. 15a, the elongated shape 101 of FIG. 15b, or the dog bone shape 103 of FIG. 15c. No dopant is introduced on the walls at the long sides of the structure for any of the geometries.

The FIG. 15 shown the location of the implanted dopant 36 and 38 following the first and second implants as shown in FIGS. 9 and 10.

Figure 17:
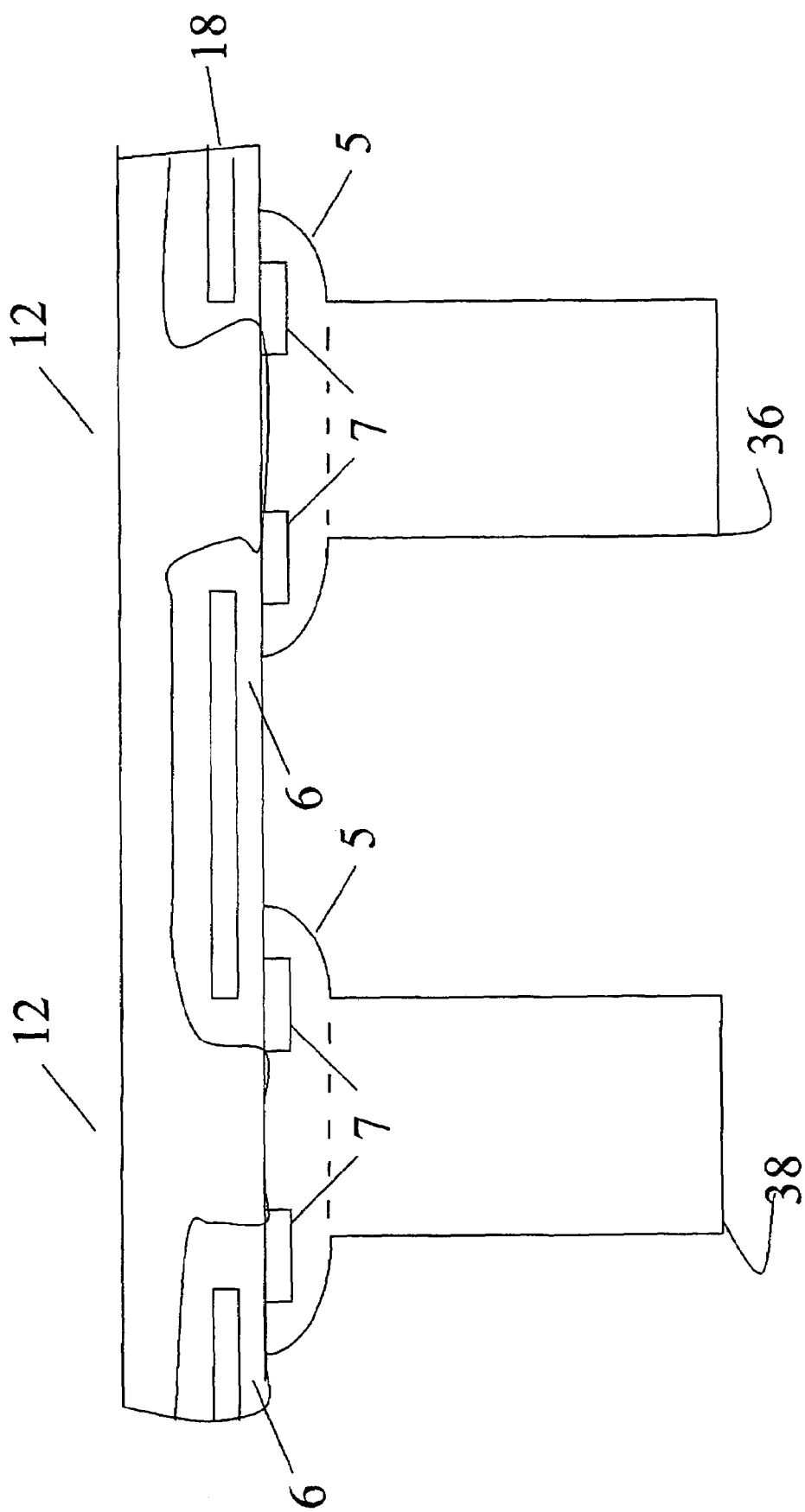
FIG. 17 is a sectional view of the disclosed device illustrating the source region.
Figure 18:
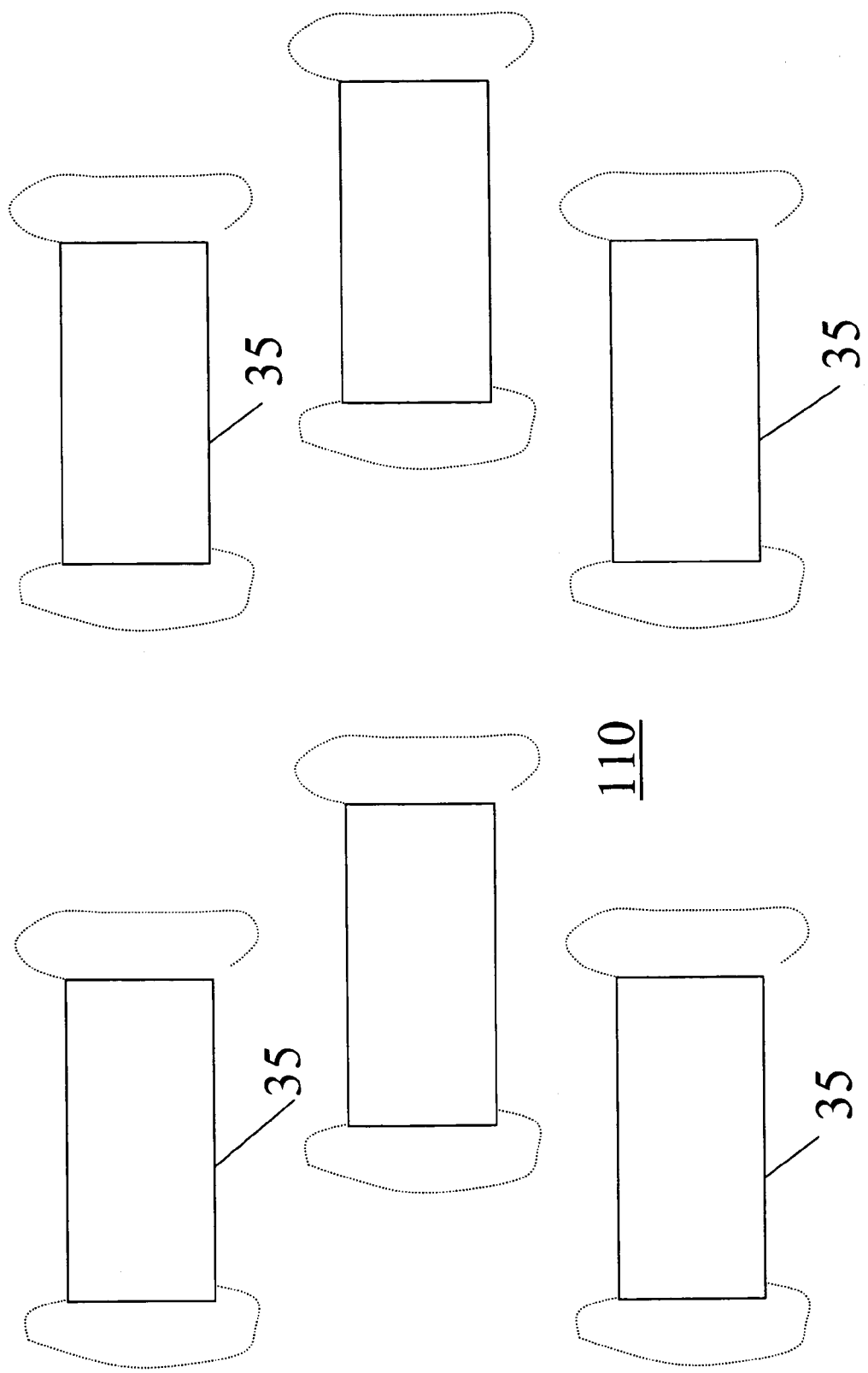

After dopant implantation and diffusion to form the doped columns, the trenches are filled. Typically a dielectric will be used, though it is possible to fill it with polysilicon and re-crystalize the polysilicon, or to fill the trench with single crystal silicon using epitaxial deposition. Once the surface is planarized, the active region that includes the body, gate dielectric and conductor, and the source regions should be placed anywhere there is no trench present to provide channel regions for carrier flow. For the array 104 of FIG. 16, active regions can be anywhere in the rows and columns between the trenches. Depending on the dimensions of the trench, polygonal, cellular or stripe geometries are all feasible. A striped geometry might run parallel to the long axis of the trenches (top row of figure). A cellular geometry might enclose each trench as sown on the bottom row 16b of the FIG. 16. If a cell is formed at each end of the trench (middle row of FIG. 16), the source injects carriers around 3 sides, but not at the fourth side. The cross section for either cellular version is the same through the doped column and is shown in FIG. 17.

Figure 19:
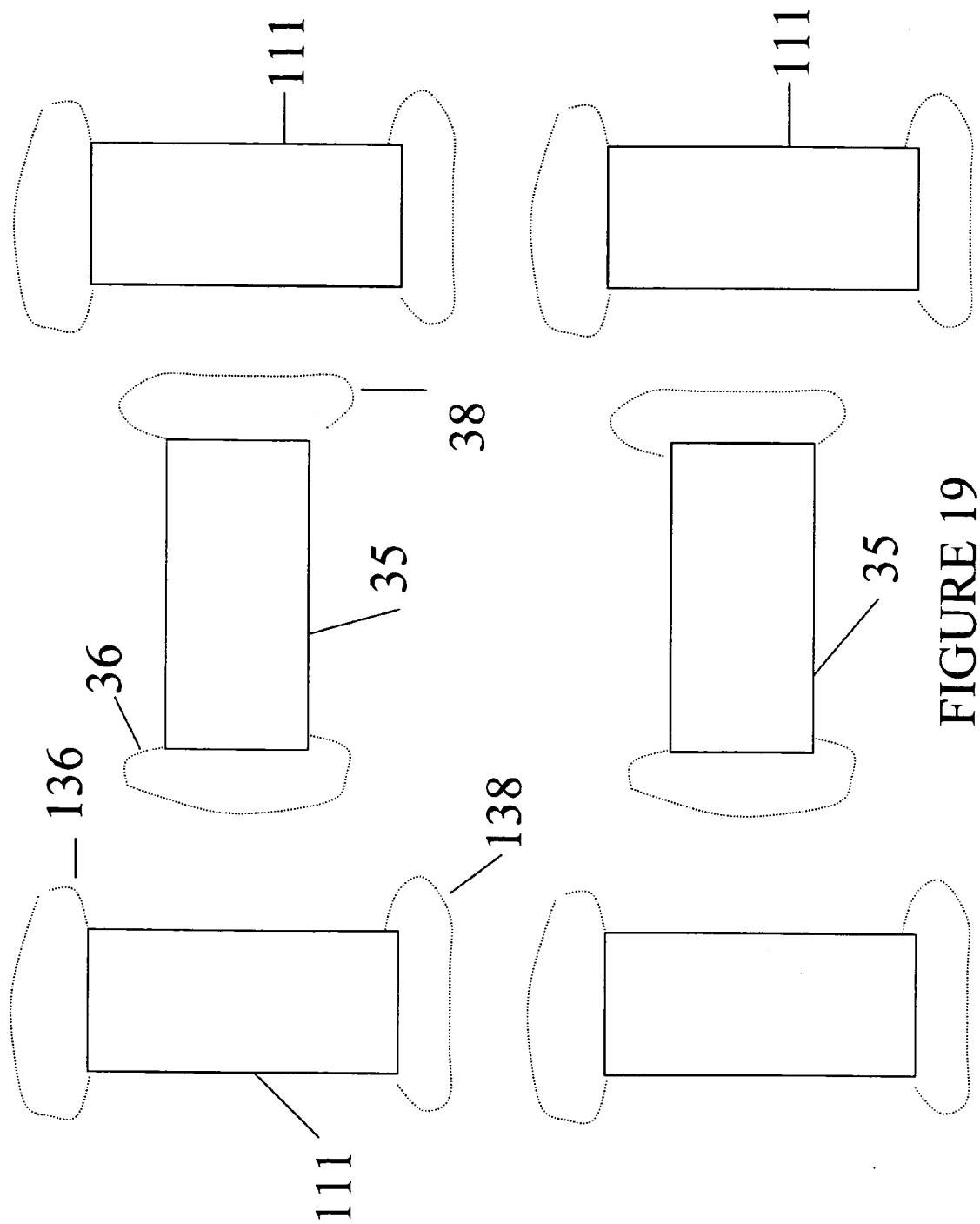

The Use of Trenches Having Different Orientations in Combination with Implants with Dopants Having Different Conductivity Types is illustrated in FIG. 19.

The creation of the active region includes the steps of implanting the P type source body region 5 on top of the P columns 36 and 38. A source 7 of N type dopant is then implanted on top of the source body regions 5. A gate oxide 6 is deposited and the gate electrode 18 is formed in the gate oxide between the rows 108 and 148 over the sources 7. Finally, the source electrode is connected to the source and source body region of each device.

Figure 23:
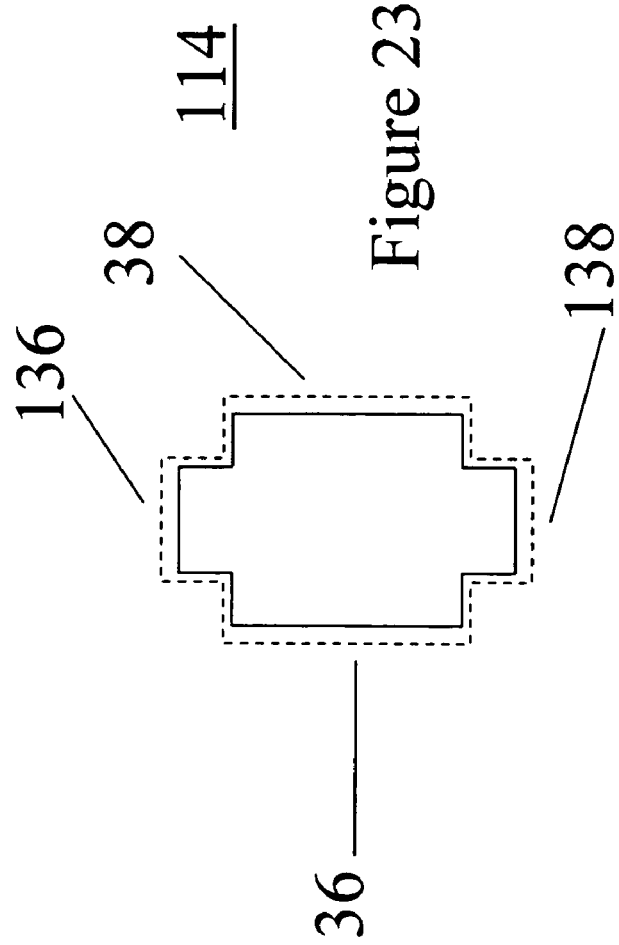

A variation of the technique that was previously discussed uses the implantation of dopants of both conductivity types in the active region of the device. In this variation, the second dopant type is implanted at an angle of 90° and 270° to the first dopant implant, as shown in FIG. 19. It provides the needed amount of dopant compensation and/or charge balance to obtain a high breakdown voltage. Where the structures 11 have N-type dopants implanted at regions 136 and 138 and P-type dopants implanted at regions 36 and 38. A second set of rectangular trenches 35 that are perpendicular to the first set of trenches 35 provide this capability are shown in FIG. 19. While geometries that allow the doping of the walls of a single trench with dopants of both conductivity types is shown in FIG. 23. Unwanted doping of the top region of any sidewall which could occur when two dopants are implanted at 90° to each other can be prevented by using a blocking layer having a greater thickness along the top part of the sidewall than previously shown.

A Compatible Termination Structure

A formation of a termination at the device perimeter that is compatible with the sequence used in the fabrication of the super-junction structure at the center of the device is often a challenge.

In the present embodiment however, it is possible to form a compatible termination structure by either using the same process sequence, or by adding one more implant to the existing process sequence. These two possibilities are discussed in greater detail below.

A Compatible Termination Structure that Requires no Additional Process Steps

Figure 20:
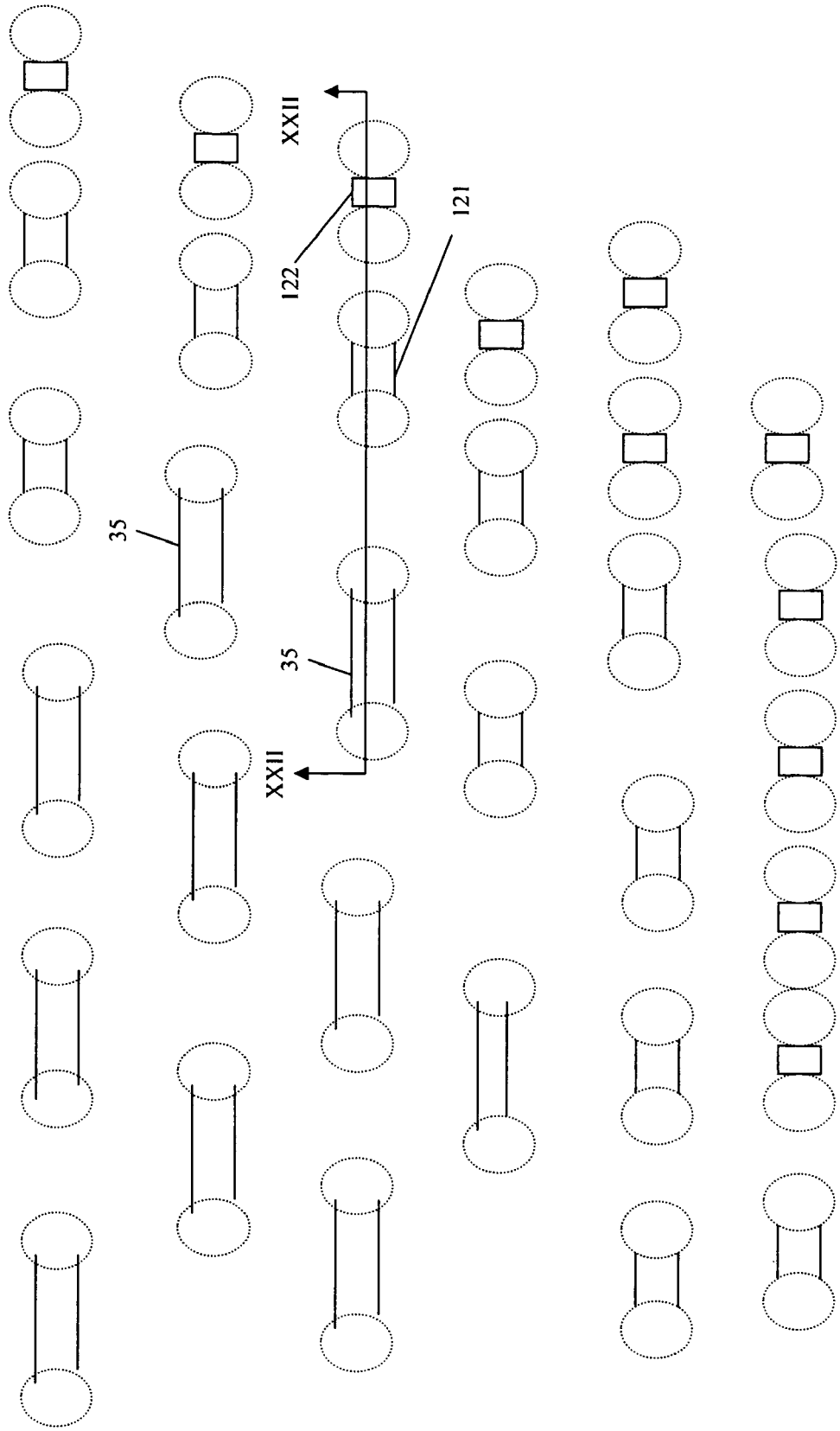
FIGS. 20, 26 and 27 illustrate possible termination arrangements of the semiconductor device.

This termination structure is best understood by referring to FIGS. 21 and 22. The FIG. 20 shows a top view and FIGS. 21 and 22 shows a side view of trenches 35, 121 an 122 at the termination having different lengths, device 207, dotted line trenched 201 and device 209 and/or having both different lengths and widths trenches 207, 211 and 200—and different width trenches 207, 201 and 205. The trench length directly determines the depth along the sidewall that is implanted on the two walls at the ends of each trench while the trench width directly affects the total charge introduced in these two sidewall. By varying the trench length and width, both the depth of the junctions formed by the introduced dopant and the total dopant amount that is introduced can be optimized. By also controlling the number and the locations of the trenches that are etched in the termination region, as shown in FIG. 20, the positions as well as the depths of the diffused p-type junctions in the termination region can be optimized to produce the highest breakdown voltage.

Figure 25:
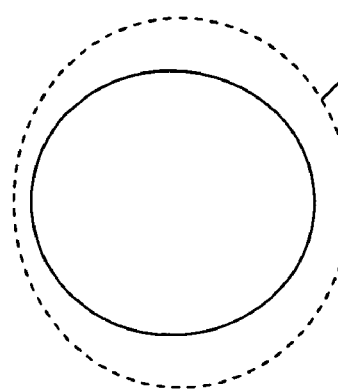
Figure 24:
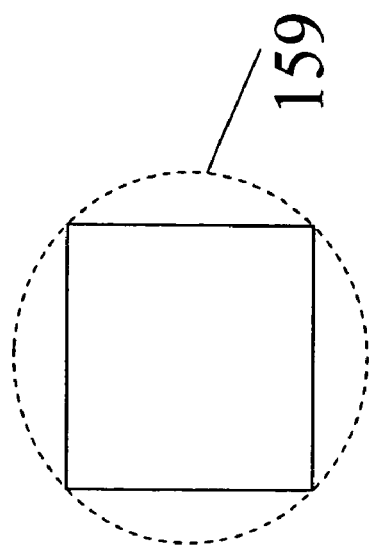
Figure 26:
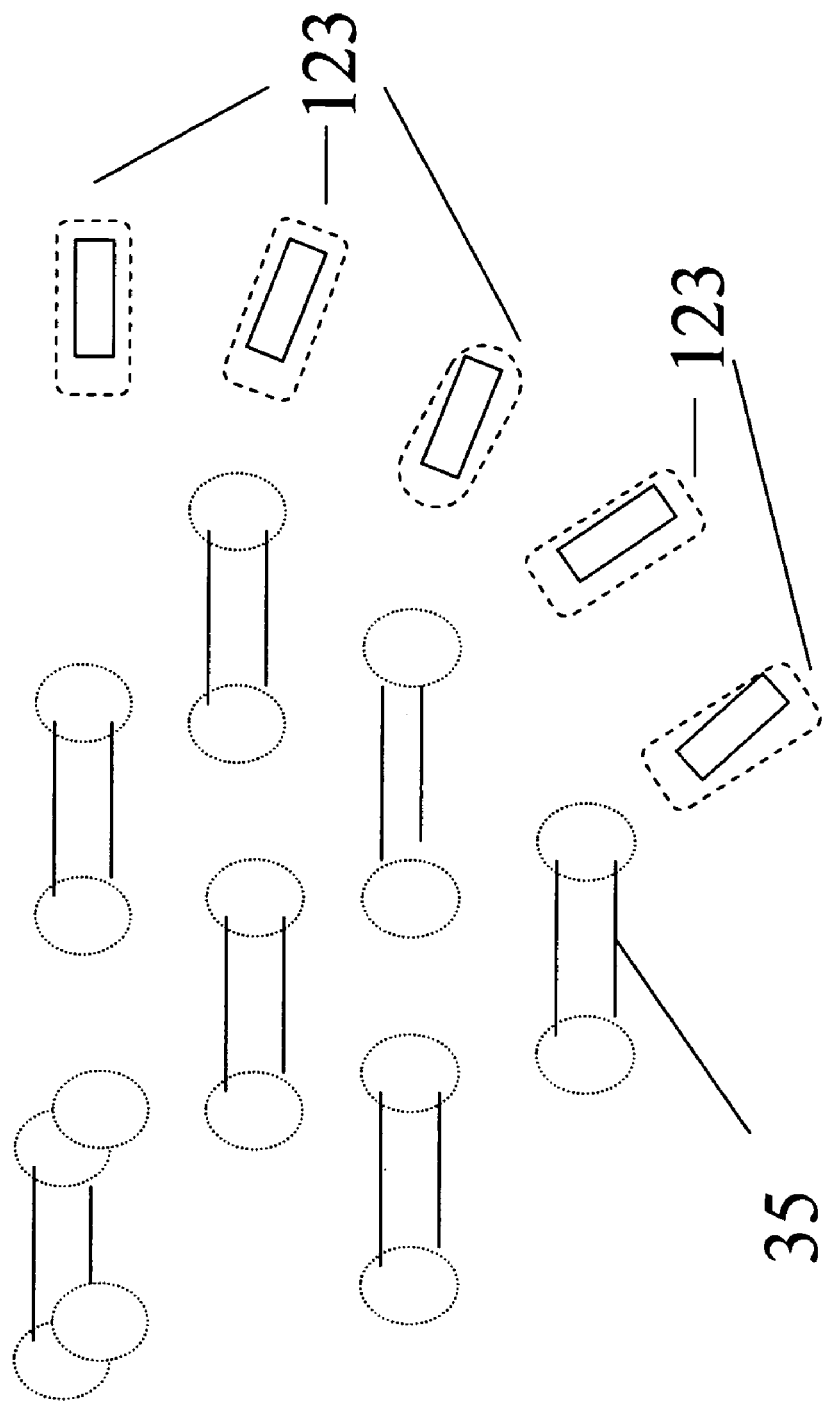

It is also possible to etch trenches that are not generally rectangular in shape (such as crosses 214, squares 215 or circles 216 of FIGS. 24 and 25) that may also have different dimensions to etch trenches that are generally rectangular in shape, but with their axes along a line that is different from that of the trenches etched in the active region of the device. Examples of these trenches are shown in FIG. 26.

A Compatible Termination Structure that Requires an Additional Implant Step

Figure 27:
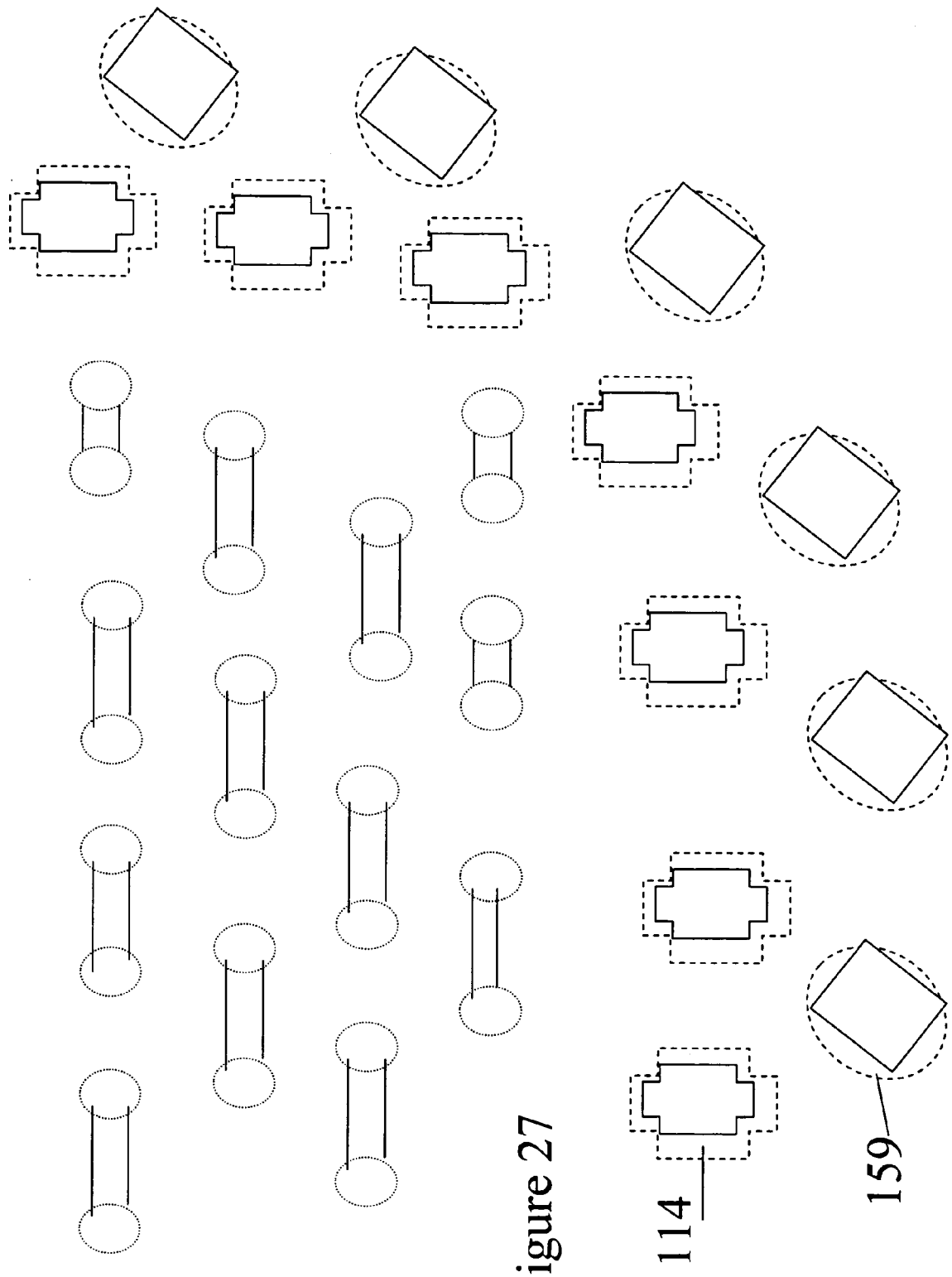

The termination structure uses a second implant step with a dopant having the same conductivity type as that of the region containing the trenches. This additional implant provides dopant that can either partially compensate the dopant from the first implant, or provide charge to balance the dopant introduced by the first implant. By etching a second set of trenches 123 that are generally rectangular shaped, and that have their major axis at an angle offset to the axis of the first set of trenches and by varying the dimensions of the trenches as discussed above, it is possible to control both the location and the amount of dopant introduced. Examples of possible termination trenches of this type are shown in FIG. 26. It is also possible to etch trenches that are not generally rectangular in shape (such as squares or trenches) that may also have different dimensions or to etch trenches that are generally rectangular in shape with their axes along a line that is different from that of the trenches etched in the active region of the device as is shown in FIGS. 19 and 27. Implanting the first dopant type along one set of axes and the second dopant type along another set of axes that is 90° to the first set of axes provides the needed amount of dopant compensation and/or charge balance to obtain a high breakdown voltage.

What is claimed is:

1. A method of manufacturing a semiconductor device comprising the steps of:
   providing a semiconductor substrate having first and second main surfaces opposite to each other, said semiconductor substrate having a heavily doped region of a first conductivity type at said second main surface and having a lightly doped region of the first conductivity type at said first main surface side;
   providing in said semiconductor substrate a plurality of trenches, with each trench having a first extending portion extending from said first main surface towards said heavily doped region to a first depth position, each trench having a first sidewall surface and a second sidewall surface in parallel alignment with the first sidewall surface;
   forming a blocking layer on the first and second sidewalls and the bottom of each trench;
   obliquely implanting a dopant of a second conductivity type into the first sidewall surface to form a first doped region of the second conductivity type at the first sidewall surface;
   obliquely implanting a dopant of the second conductivity type into the second sidewall surface, to provide a second doped region of the second conductivity type at the second surface;
   removing the blocking layer from the first and second sidewalls and bottoms of each trench;
   etching the bottoms of the trench to remove any implanted dopants of the second conductivity type;
   diffusing the implanted dopant of the second conductivity type; and filling the trenches.

2. The method according to claim 1, wherein the plurality of trenches are arranged in an array and the method further comprises:
   providing a third doped region of the second conductivity type at said first main surface side of said first doped region to be electrically connected to said first region of a first trench;
   providing a fourth doped region of the second conductivity type at said first main surface side of said second doped region to be electrically connected to said second region of a second trench; and
   providing a gate electrode layer between said third and fourth doped regions, with a gate insulation layer interposed there between.

3. The method according to claim 2, wherein said gate electrode insulator layer is formed on said first main surface.

4. The method according to claim 1 wherein each of the plurality of trenches has a rectangular shape and the first and second sidewalls are each located on a narrow side of the rectangular shape.

5. The method according to claim 4 further comprising following the step of obliquely implanting a dopant of the second conductivity type into the second sidewall surface, to provide a second doped region of the second conductivity type at the second surface, performing the steps of:
   obliquely implanting a dopant of the first conductivity type into a third sidewall surface to form a third doped region of the first conductivity type; and
   obliquely implanting a dopant of the first conductivity type into a fourth sidewall surface opposite the third sidewall surface, to provide a fourth doped region of the first conductivity type at the second surface.

6. The method according to claim 1 wherein each of the plurality of trenches has a cross shape and the first and second sidewalls are each located on an ordinate leg of the cross.

7. The method according to claim 6 further comprising, following the step of obliquely implanting a dopant of the second conductivity type into the second sidewall surface, to provide a second doped region of the second conductivity type at the second surface, performing the steps of:
   obliquely implanting a dopant of the first conductivity type into a third sidewall surface to form a third doped region of the first conductivity type;
   obliquely implanting a dopant of the first conductivity type into a fourth sidewall surface opposite the third sidewall surface, to provide a fourth doped region of the first conductivity type at the fourth surface and wherein the third and fourth sidewall surfaces are located on an abscissa leg of the cross.

8. The method according to claim 1 wherein each of the plurality of trenches has a rectangular shape and the first and second sidewalls are each located on a narrow side of the rectangular shape with the plurality of trenches being arranged in a plurality of columns.

9. The method according to claim 8 wherein at least two of the columns are separated from each other by a second plurality of trenches arranged in rows, and the method further comprises, following the step of, obliquely implanting a dopant of the second conductivity type into the second sidewall surface, to provide a second doped region of the second conductivity type at the second surface, performing the steps of
   obliquely implanting a dopant of the first conductivity type into the first sidewall surface to form a first doped region of the first conductivity type in each member of the second plurality of trenches; and
   obliquely implanting a dopant of the first conductivity type into a second sidewall surface opposite the first sidewall surface, to provide a second doped region of the first conductivity type at the second surface in each member of the second plurality of trenches.

10. The method according to claim 1 wherein the step of obliquely implanting a dopant of a second conductivity type into the first sidewall surface to form a first doped region of the second conductivity type at the first sidewall surface further comprises implanting the dopant at a first angle.

11. The method according to claim 10 wherein the first angle is less than the tangent of the depth of the trench to the width of a side of the trench that is at right angle to the first sidewall surface.

12. The method according to claim 11 wherein the step of obliquely implanting a dopant of the second conductivity type into the second sidewall surface to form a second doped region of the second conductivity type at the second sidewall surface further comprises implanting the dopant at a second angle that is ninety degrees larger than the first angle.

13. A method of manufacturing a semiconductor device comprising the steps of:
   providing a semiconductor substrate having first and second main surfaces opposite to each other, said semiconductor substrate having a heavily doped region of a first conductivity type at said second main surface and having a lightly doped region of the first conductivity type at said first main surface side;
   providing in said semiconductor substrate a plurality of trenches, with each trench having a first extending portion extending from said first main surface towards said heavily doped region to a first depth position, each trench having a first sidewall surface and a second sidewall surface in parallel alignment with the first sidewall surface;

forming a blocking layer on the first and second sidewalls and the bottom of each trench;

obliquely implanting a dopant of a second conductivity type into the first sidewall surface at a first angle that is less than the tangent of the depth of the trench to the width of a side of the trench that is at right angle to the first sidewall surface to form a first doped region of the second conductivity type at the first sidewall surface;

obliquely implanting a dopant of the second conductivity type into the second sidewall surface at a second angle that is ninety degrees larger than the first angle, to provide a second doped region of the second conductivity type at the second surface;

removing the blocking layer from the first and second sidewalls and bottoms of each trench;

diffusing the implanted dopant of the second conductivity type; and filling the trenches.

14. The method according to claim 13, wherein the plurality of trenches are arranged in an array and the method further comprises:

providing a third doped region of the second conductivity type at said first main surface side of said first doped region to be electrically connected to said first region of a first trench;

providing a fourth doped region of the second conductivity type at said first main surface side of said second doped region to be electrically connected to said second region of a second trench; and providing a gate electrode layer between said third and fourth doped regions, with a gate insulation layer interposed there between.

15. The method according to claim 14, wherein said gate electrode insulator layer is formed on said first main surface.

16. The method according to claim 13 wherein each of the plurality of trenches has a rectangular shape and the first and second sidewalls are each located on a narrow side of the rectangular shape.

17. The method according to claim 16 further comprising following the step of obliquely implanting a dopant of the second conductivity type into the second sidewall surface, to provide a second doped region of the second conductivity type at the second surface, performing the steps of:

obliquely implanting a dopant of the first conductivity type into a third sidewall surface to form a third doped region of the first conductivity type; and obliquely implanting a dopant of the first conductivity type into a fourth sidewall surface opposite the third sidewall surface, to provide a fourth doped region of the first conductivity type at the second surface.

18. The method according to claim 13 wherein each of the plurality of trenches has a cross shape and the first and second sidewalls are each located on a ordinate leg of the cross.

19. The method according to claim 18 further comprising, following the step of obliquely implanting a dopant of the second conductivity type into the second sidewall surface, to provide a second doped region of the second conductivity type at the seco surface, performing the steps of:

obliquely implanting a dopant of the first conductivity type into a third sidewall surface to form a third doped region of the first conductivity type;

obliquely implanting a dopant of the first conductivity type into a fourth sidewall surface opposite the third sidewall surface, to provide a fourth doped region of the first conductivity type at the fourth surface and wherein the third and fourth sidewall surfaces are located on an abscissa leg of the cross.

20. The method according to claim 13 wherein each of the plurality of trenches has a rectangular shape and the first and second sidewalls are each located on a narrow side of the rectangular shape with the plurality of trenches being arranged in a plurality of columns.

21. The method according to claim 20 wherein at least two of the columns are separated from each other by a second plurality of trenches arranged in rows, and the method further comprises, following the step of, obliquely implanting a dopant of the second conductivity type into the second sidewall surface, to provide a second doped region of the second conductivity type at the second surface, performing the steps of:

obliquely implanting a dopant of the first conductivity type into the first sidewall surface to form a first doped region of the first conductivity type in each member of the second plurality of trenches; and obliquely implanting a dopant of the first conductivity type into a second sidewall surface opposite the first sidewall surface, to provide a second doped region of the first conductivity type at the second surface in each member of the second plurality of trenches.

* * * * *